(12) United States Patent
Kawai et al.

(10) Patent No.: US 12,293,790 B2
(45) Date of Patent: May 6, 2025

(54) MEMORY FOR PROGRAMMING DATA STATES OF MEMORY CELLS

(71) Applicant: MICRON TECHNOLOGY, INC., Boise, ID (US)

(72) Inventors: Koichi Kawai, Yokohama (JP); Yoshihiko Kamata, Yokohama (JP); Akira Goda, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 238 days.

(21) Appl. No.: 17/894,248

(22) Filed: Aug. 24, 2022

(65) Prior Publication Data

US 2024/0071507 A1  Feb. 29, 2024

(51) Int. Cl.
*G11C 16/10* (2006.01)
*G11C 7/10* (2006.01)
*G11C 16/34* (2006.01)
*H03K 19/017* (2006.01)

(52) U.S. Cl.
CPC .......... *G11C 16/102* (2013.01); *G11C 7/1048* (2013.01); *G11C 16/3459* (2013.01); *H03K 19/01742* (2013.01)

(58) Field of Classification Search
CPC ................................................. G11C 16/102
USPC ..................................................... 365/185.09
See application file for complete search history.

(56) References Cited

U.S. PATENT DOCUMENTS

| | | | |
|---|---|---|---|
| 9,396,791 B2 | 7/2016 | Raghunathan et al. | |
| 10,741,252 B2* | 8/2020 | Lee | G11C 16/0483 |
| 11,562,791 B1* | 1/2023 | Nguyen | G11C 16/24 |
| 2011/0080789 A1 | 4/2011 | Kalavade et al. | |
| 2014/0355356 A1* | 12/2014 | Lim | G11C 16/28 |
| | | | 365/185.23 |
| 2022/0208288 A1 | 6/2022 | Sharma | |

OTHER PUBLICATIONS

Nguyen, et al., "Memory Devices With Four Data Line Bias Levels", U.S. Appl. No. 17/396,825, filed Aug. 9, 2021, Total pp. 57.

* cited by examiner

*Primary Examiner* — Anthan Tran
(74) *Attorney, Agent, or Firm* — Dicke, Billig & Czaja, PLLC

(57) ABSTRACT

Memories might include a controller configured to cause the memory to apply a first voltage level indicative of a data state of a memory cell of an array of memory cells to a control gate of a transistor, retain the first voltage level on the control gate of the transistor, connect a first source/drain of the transistor to a data line corresponding to the memory cell while applying a second voltage level to a second source/drain of the transistor and while retaining the first voltage level on the control gate of the transistor, and apply a programming pulse to a control gate of the memory cell while the data line is connected to the first source/drain of the transistor.

21 Claims, 27 Drawing Sheets

MEMORY FOR PROGRAMMING DATA STATES OF MEMORY CELLS

TECHNICAL FIELD

The present disclosure relates generally to memory and, in particular, in one or more embodiments, the present disclosure relates to apparatus and methods for programming data states of memory cells.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC might use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

DETAILED DESCRIPTION

Figure 1:
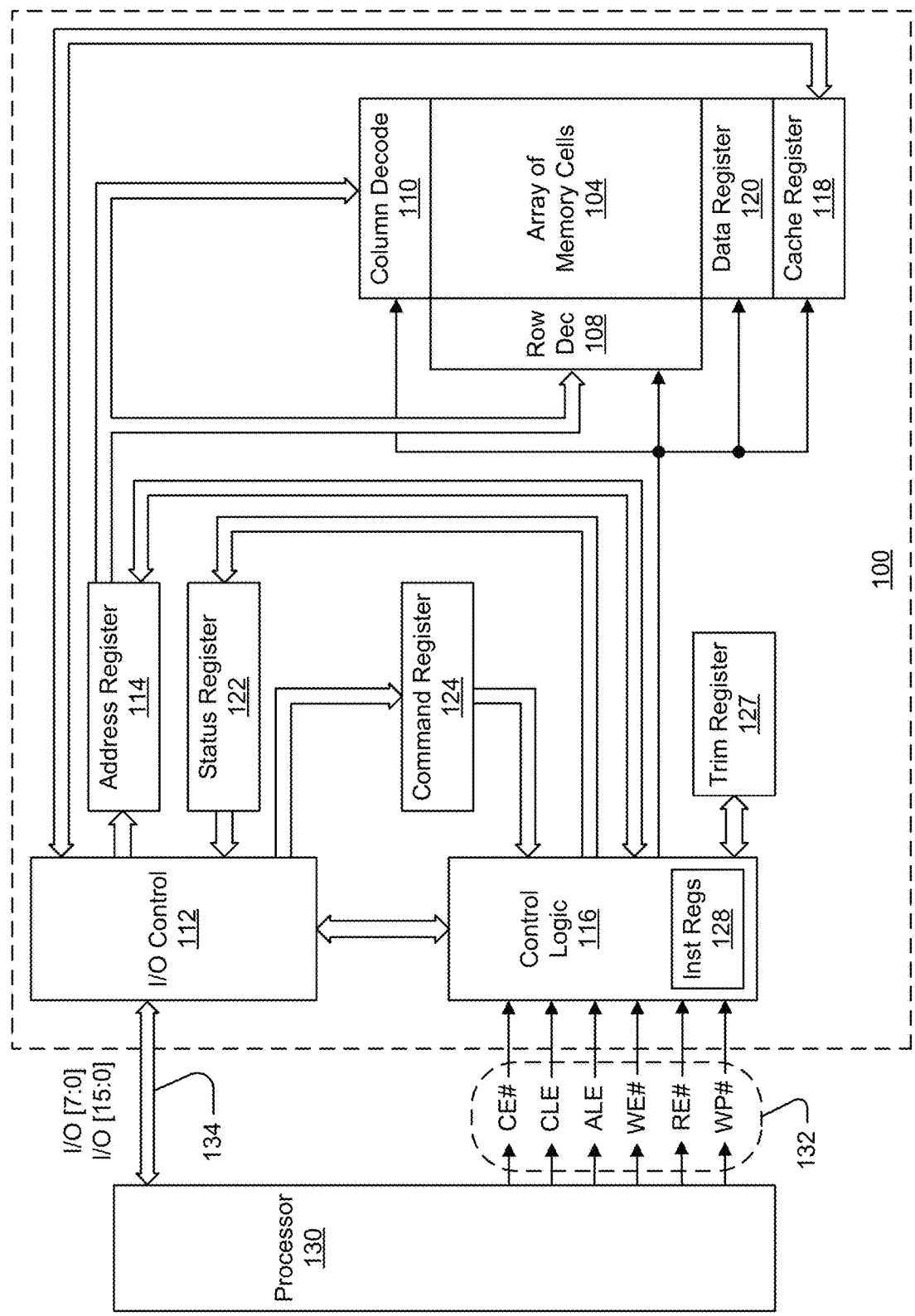
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by an electrically conductive path unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

Programming in memories is typically accomplished by applying one or more programming pulses, separated by verify pulses, to program each memory cell of a selected group of memory cells to a respective target data state (which might be an interim or final data state). With such a scheme, the programming pulses are applied to access lines, such as those typically referred to as word lines, for selected memory cells. After each programming pulse, one or more verify voltage levels are typically used to verify the programming of the selected memory cells. Programming typically uses many programming pulses in an incremental step pulse programming (ISPP) scheme, where each programming pulse is a single-level pulse that moves the memory cell threshold voltage by some amount.

The programming pulses might be applied to a selected access line (e.g., word line) and thus to the control gates of the row of memory cells connected to the selected access line (e.g., having their control gates connected to the selected access line). Typical programming pulses might start at or near 13V and tend to increase in magnitude for each subsequent programming pulse application. While the program potential (e.g., voltage level of the programming pulse) is applied to the selected access line, an enable voltage, such as a reference potential (e.g., 0V), might be applied to the channels of memory cells selected for programming, i.e., those memory cells for which the programming operation is intended to shift their data state to some higher level. This might result in a charge transfer from the channel to the charge storage structures of these selected memory cells. For example, floating gates are typically charged through direct injection or Fowler-Nordheim tunneling of electrons from the channel to the floating gate, resulting in an increased threshold voltage in a programmed state.

An inhibit voltage (e.g., Vcc) is typically applied to data lines which are selectively connected to a NAND string containing a memory cell that is connected to the selected access line and is not selected for, or is no longer selected for, programming. In addition to data lines selectively connected to memory cells already at their target data state, these unselected data lines might further include data lines that are not addressed by the programming operation. For example, a logical page of data might correspond to memory cells connected to a particular access line and selectively connected to some particular subset of the data lines (e.g., every other data line), such that the remaining subset of data lines would be unselected for the programming operation and thus inhibited.

Between the application of one or more programming pulses, a verify phase of the programming operation is typically performed to check each selected memory cell to determine if it has reached its target data state. If a selected memory cell has reached its target data state, it might be inhibited from further programming if there remain other selected memory cells still requiring additional programming pulses to reach their target data states. Following a verify phase, an additional programming pulse might be applied if there are memory cells that have not completed programming. This process of applying a programming pulse followed by verification (e.g., a programming phase and a verify, or sensing, phase of a programming operation) typically continues until all the selected memory cells have reached their target data states. If a particular number of programming pulses (e.g., maximum number) have been applied, or a particular voltage level of a programming pulse (e.g., maximum voltage level) has been reached, and one or more selected memory cells still have not completed programming, those memory cells might be marked as defective, for example.

The use of different voltage levels on data lines to be enabled for programming might occur in programming schemes known as selective slow programming convergence (SSPC), where memory cells nearer to their respective target data states are programmed more slowly (e.g., partially enabled for programming) compared to memory cells farther from their respective target data states (e.g., fully enabled for programming) while receiving a same voltage level at their respective control gates. SSPC programming schemes can facilitate more narrow distributions of threshold voltages defining each data state over more traditional programming schemes that rely on memory cells being either fully enabled or inhibited from programming. By narrowing the threshold voltage distributions, and thus providing more dead space, or margin, between adjacent threshold voltage distributions, accuracy of determining data states of memory cells might be improved and/or memory density (e.g., number of digits of data per memory cell) might be increased.

Although SSPC programming schemes can provide for tighter threshold voltage distributions over more traditional programming schemes, that benefit typically comes with a cost. In particular, memory cells subject to the programming operation must generally be apportioned to different subsets of memory cells for each programming pulse, e.g., one subset of memory cells to be inhibited from programming, one subset of memory cells to be enabled (e.g., fully enabled) for programming, and one subset of memory cells for each level of partial enablement of programming. Each subset of memory cells might correspond to a respective, mutually exclusive, range of threshold voltages. The threshold voltage for each memory cell subject to the programming operation must generally be determined or estimated in order to apportion it to the proper subset of memory cells. This can add time and/or complexity to the verify phase of the programming operation.

Various embodiments seek to facilitate further narrowing of threshold voltage distributions over typical SSPC programming schemes, while mitigating a need to apportion memory cells for each level of partial enablement of programming. Such embodiments might provide a data line voltage level during a subsequent programming pulse that is inversely related to its corresponding NAND string current level (e.g., $I_{string}$) during a verify phase of the programming operation (e.g., an immediately prior verify phase of the programming operation). Consider the example of eight NAND strings each having a memory cell selected for programming during a programming operation, and exhibiting $I_{string}$ values of $I_0$, $I_1$, $I_2$, $I_3$, $I_4$, $I_5$, $I_6$, and $I_7$ during a verify phase of the programming operation, where $I_0 < I_1 < I_2 < I_3 < I_4 < I_5 < I_6 < I_7$. During a subsequent programming pulse, their corresponding data lines might receive voltage levels of $V_0$, $V_1$, $V_2$, $V_3$, $V_4$, $V_5$, $V_6$, and $V_7$, respectively, where $V_0 > V_1 > V_2 > V_3 > V_4 > V_5 > V_6 > V_7$.

Various embodiments might capture a retained voltage level of a node of a page buffer circuit following or during a verify phase of the programming operation. During the verify phase of the programming operation, the node might be precharged, and then selectively discharged through a data line responsive to a level of activation of a selected memory cell of a programming operation. As such, a memory cell having a higher threshold voltage, e.g., lower $I_{string}$ in response to a given control gate voltage level, might be expected to result in a higher retained voltage level at the node than a memory cell having a lower threshold voltage, e.g., higher $I_{string}$ in response to the given control gate voltage level. The remaining voltage level of the node might subsequently be used as a control voltage of a source-follower to generate a data line voltage level for a subsequent programming operation. In this manner, memory cells closer to their target threshold voltage might be expected to receive a higher data line voltage, e.g., lower level of partial enablement, and memory cells farther from their target threshold voltage might be expected to receive a lower data line voltage, e.g., higher level of partial enablement.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

Row decode circuitry 108 and column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112, and with row decode circuitry 108 and column decode circuitry 110, to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and might generate status information for the external processor 130, i.e., control logic 116 is configured to perform array operations (e.g., sensing operations [which might include read operations and verify phases of programming operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104. The control logic 116 might be configured to cause the memory, e.g., to cause relevant components of the memory, to perform methods according to various embodiments, e.g., through execution of computer-readable instructions stored to the instruction registers 128.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104, then new data might be latched in the cache register 118 from the I/O control circuitry 112. During a read operation, data might be passed from the cache register 118 to the I/O control circuitry 112 for output to the external processor 130, then new data might be passed from the data register 120 to the cache register 118. The cache register 118 and/or the data register 120 might form (e.g., might form a portion of) a page buffer of the memory device 100. A data register 120 might further include page buffer circuits (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

A trim register 127 might be in communication with the control logic 116. The trim register 127 might represent a volatile memory, latches, or other storage location, e.g., volatile or non-volatile. For some embodiments, the trim register 127 might represent a portion of the array of memory cells 104. Trims might be used by the memory to set values used by an array operation, e.g., voltage levels, timing characteristics, etc., or might be used to selectively activate or deactivate features of the memory.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
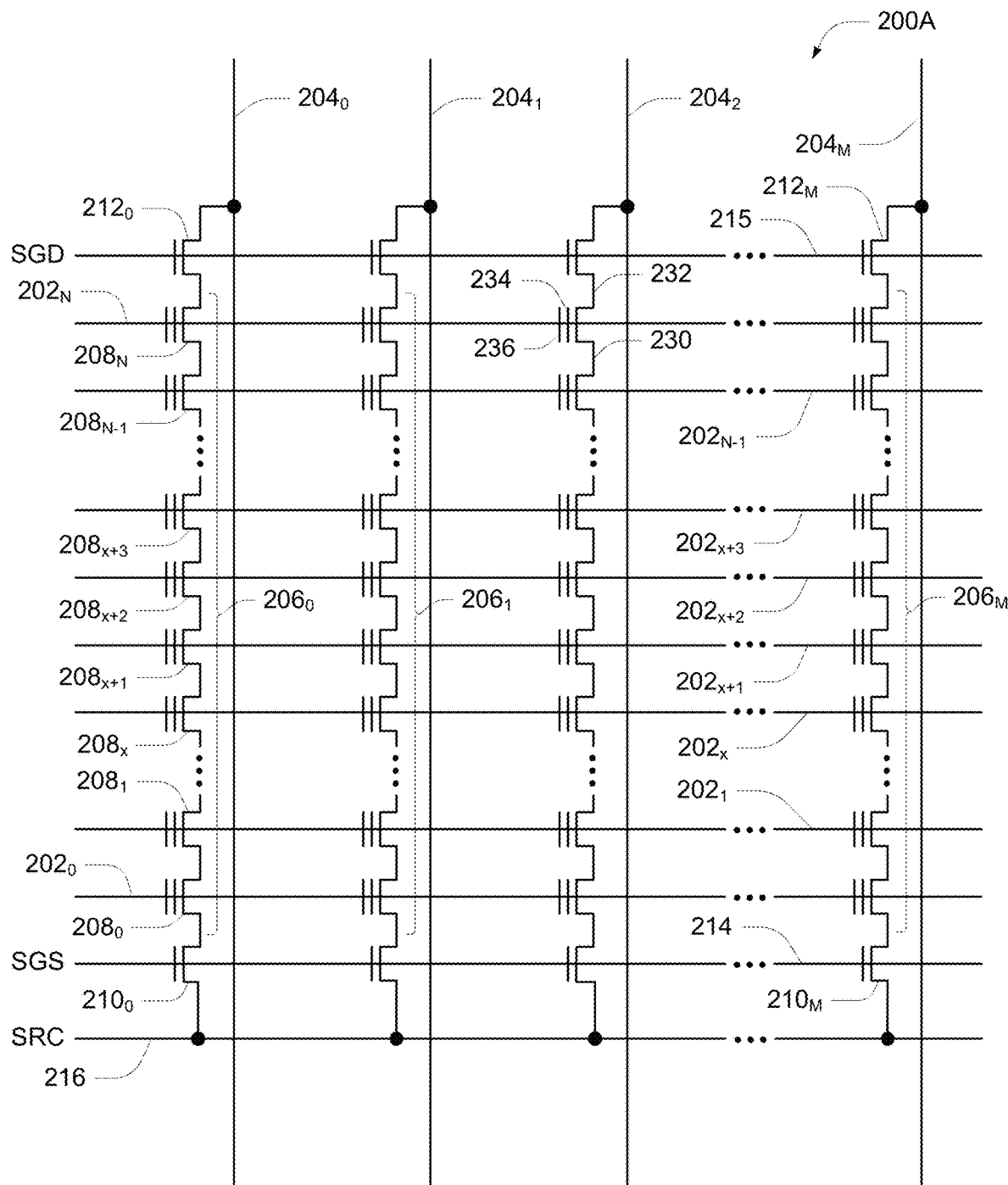
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal. In addition, for embodiments utilizing a plurality of select gates connected in series, such select gates might be configured to have the same or different threshold voltages. For example, where gate-induced drain leakage current (GIDL) is desired for programming operations, one or more select gates of the series-connected select gates might have a different (e.g., lower) threshold voltage than one or more other select gates of the series-connected select gates.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, 2042, 2044, etc.) might be one physical page of memory cells 208 (e.g., even memory cells) while memory cells 208 commonly connected to access line $202_N$ and selectively connected to odd data lines 204 (e.g., data lines 2041, 2043, 2045, etc.) might be another physical page of memory cells 208 (e.g., odd memory cells). Although data lines 2043-2045 are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
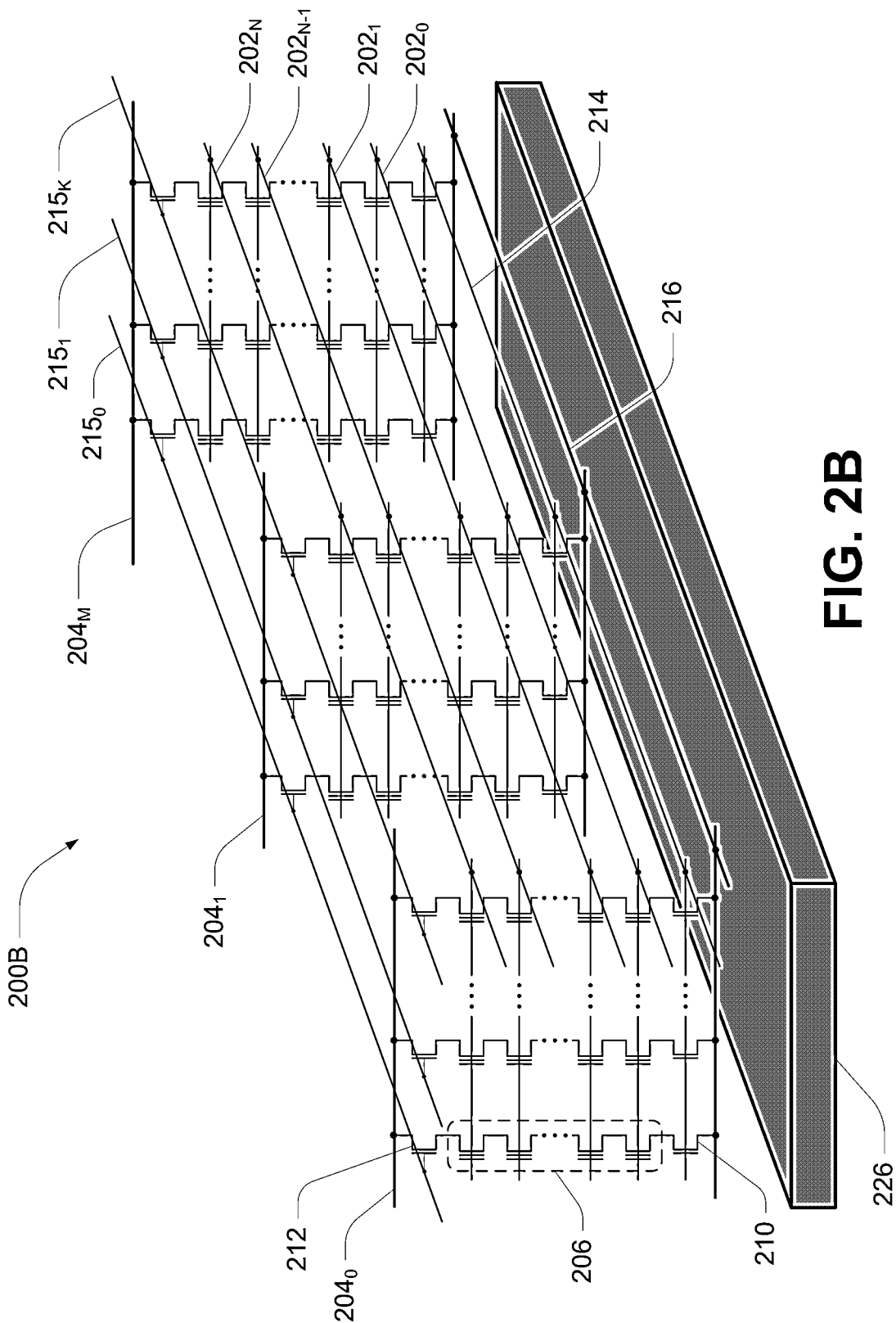

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars, which might be solid or hollow, where a portion of a pillar might act as a channel region of the memory cells of NAND strings 206, e.g., a region through which current might flow when a memory cell, e.g., a field-effect transistor, is activated. The NAND strings 206 might be each selectively connected to a data line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$-$215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel region and p-channel region transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
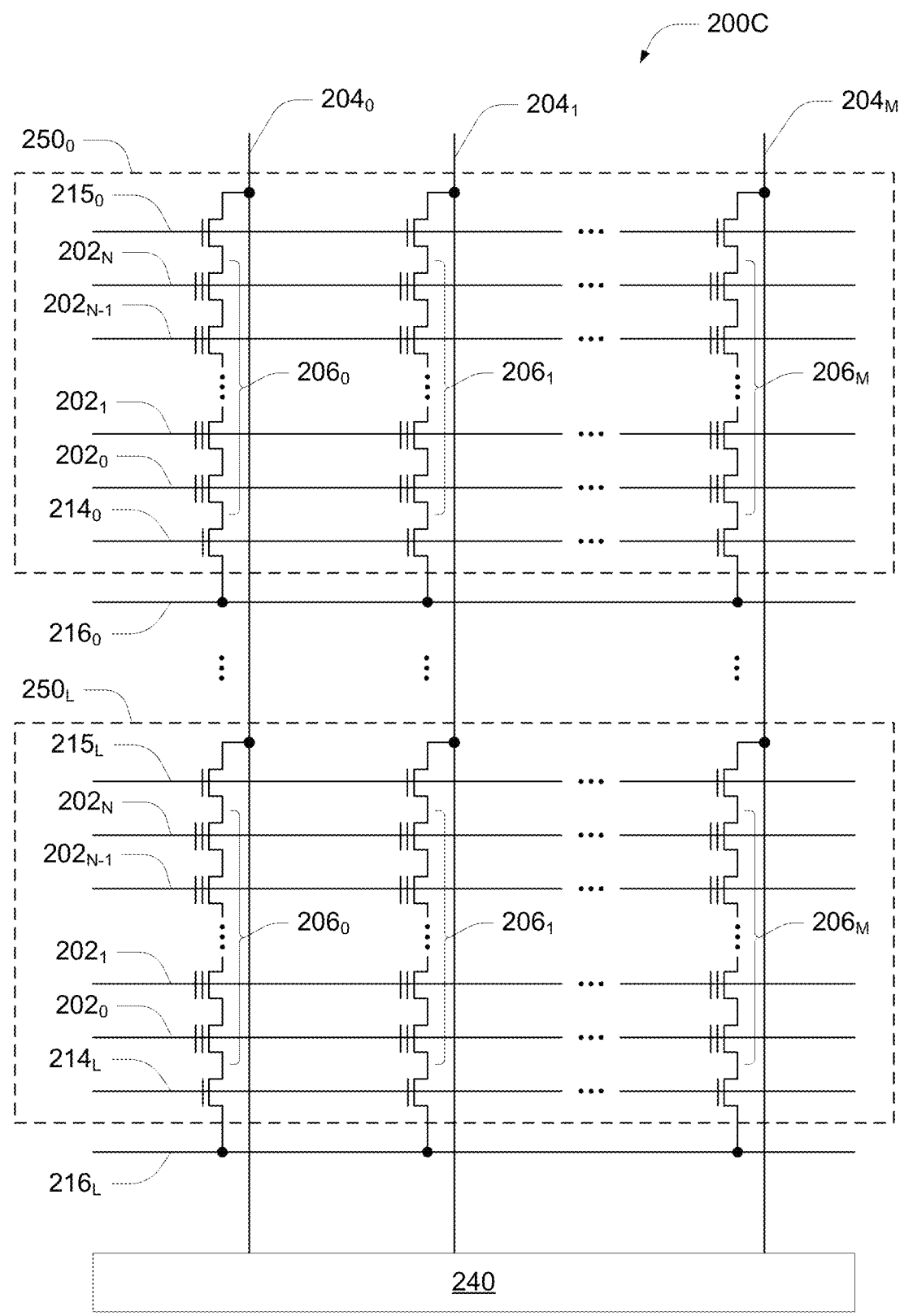

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C might include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A might be a portion of the array of memory cells 200C, for example. FIG. 2C depicts groupings of NAND strings 206 into blocks of memory cells 250, e.g., blocks of memory cells $250_0$-$250_L$. Blocks of memory cells 250 might be groupings of memory cells 208 that might be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 might have no direct connection to access lines 202 and select lines 214 and 215, respectively, of any other block of memory cells 250 of the blocks of memory cells $250_0$-$250_L$.

The data lines $204_0$-$204_M$ might be connected (e.g., selectively connected) to a buffer portion 240, which might be a portion of a page buffer of the memory. The buffer portion 240 might correspond to a memory plane (e.g., the set of blocks of memory cells $250_0$-$250_0$. The buffer portion 240 might include page buffer circuits (not shown in FIG. 2C) for programming data values to, and sensing data values from, memory cells selectively connected to respective data lines 204. The buffer portion 240 might include a portion of the data register 120 and a portion of the cache register 118 corresponding to the blocks of memory cells $250_0$-$250_L$.

Figure 3A:
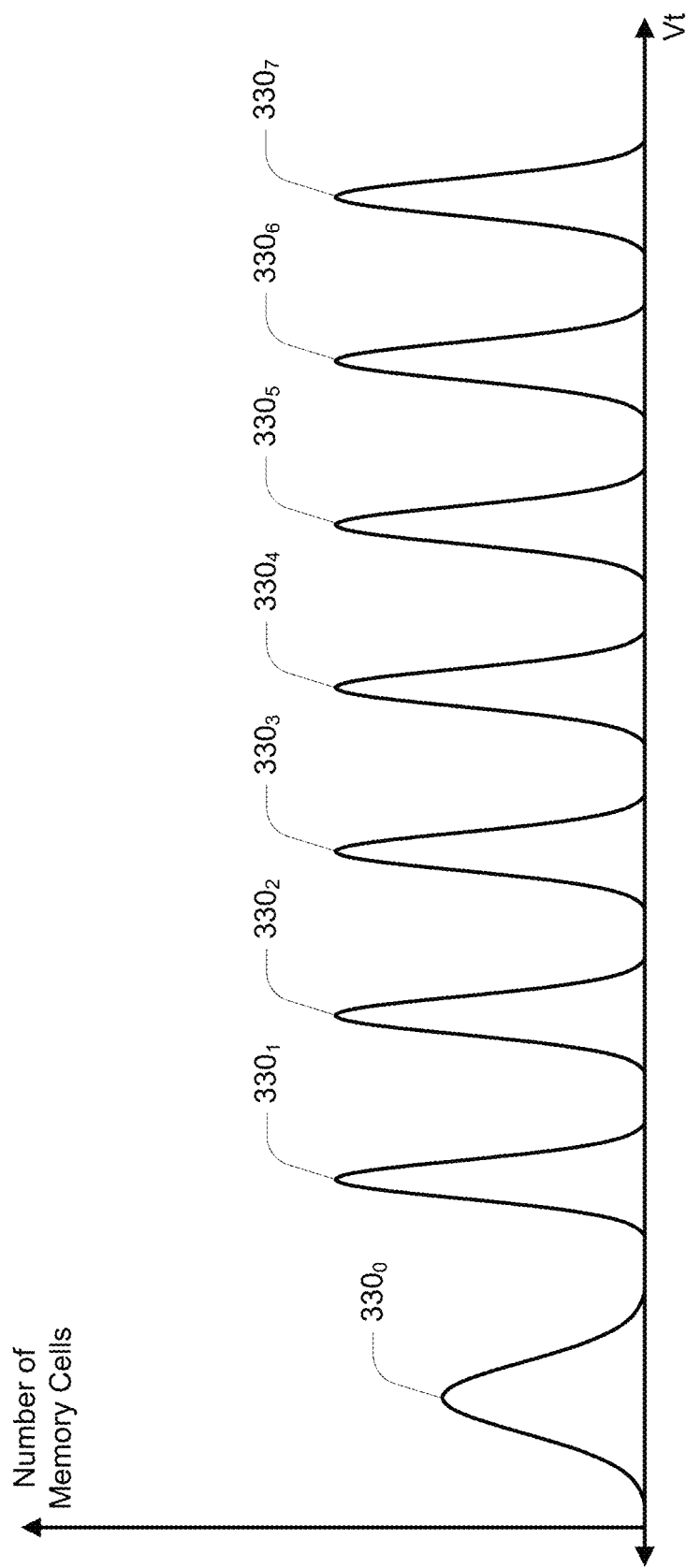
FIGS. 3A-3B are conceptual depictions of threshold voltage distributions of a plurality of memory cells.
Figure 3B:
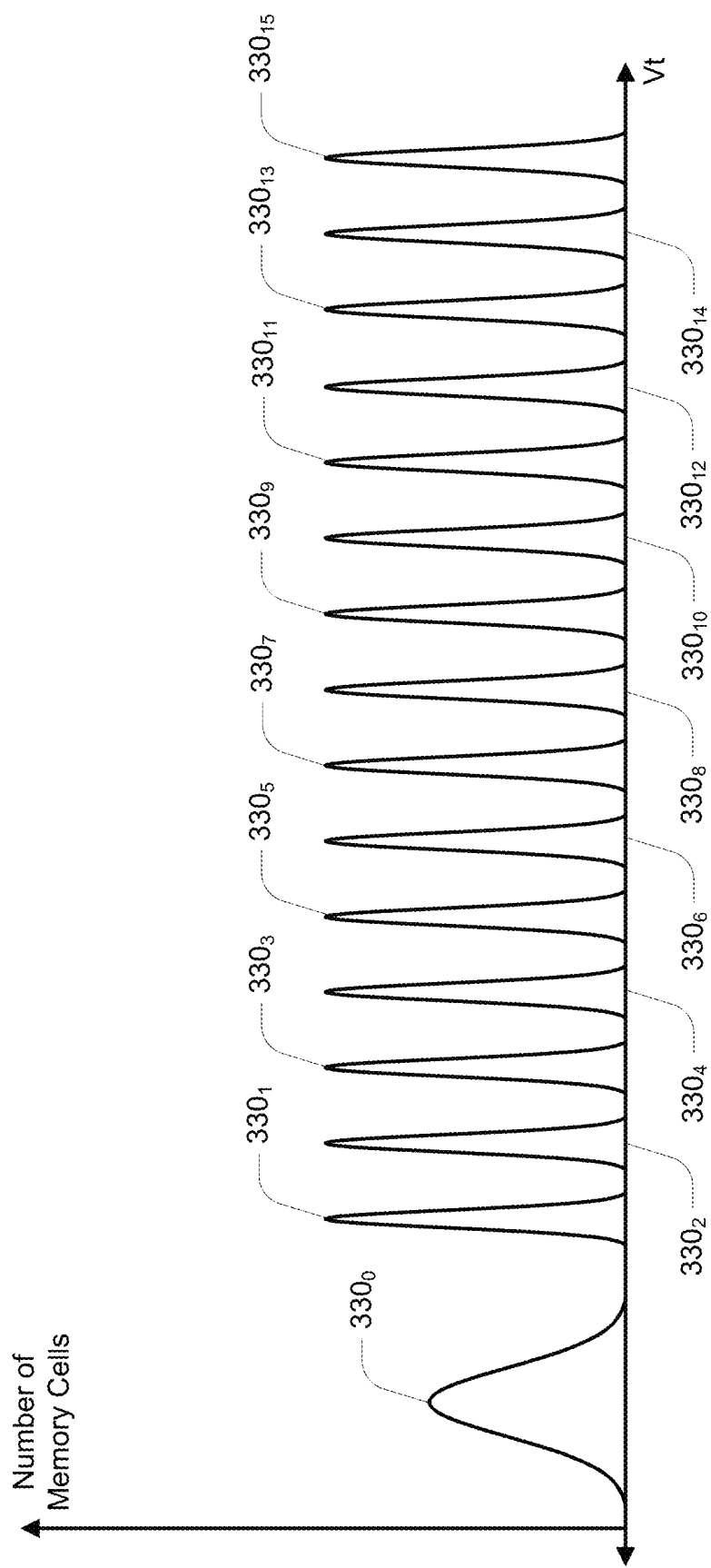

FIG. 3A is a conceptual depiction of threshold voltage ranges of a plurality of memory cells. FIG. 3B illustrates an example of threshold voltage ranges and their distributions for a population of a eight-level memory cells, often referred to as TLC memory cells. For example, such a memory cell might be programmed to a threshold voltage (Vt) that falls within one of eight different threshold voltage ranges $330_0$-$330_7$, each being used to represent a data state corresponding to a bit pattern of three bits. The threshold voltage range $330_0$ typically has a greater width than the remaining threshold voltage ranges $330_1$-$330_7$ as memory cells are generally all placed in the data state corresponding to the threshold voltage range $330_0$, then subsets of those memory cells are subsequently programmed to have threshold voltages in one of the threshold voltage ranges $330_1$-$330_7$. As programming operations are generally more incrementally controlled than erase operations, these threshold voltage ranges $330_1$-$330_7$ may tend to have tighter distributions.

The threshold voltage ranges $330_0$, $330_1$, $330_2$, $330_3$, $330_4$, $330_5$, $330_6$, and $330_7$ might each represent a respective data state, e.g., $L_0$, $L_1$, $L_2$, $L_3$, $L_4$, $L_5$, $L_6$, and $L_7$, respectively. As an example, if the threshold voltage of a memory cell is within the first of the eight threshold voltage ranges $330_0$, the memory cell in this case may be storing a data state L0 having a data value of logical '111' and is typically referred to as the erased state of the memory cell. If the threshold voltage is within the second of the eight threshold voltage ranges $330_1$, the memory cell in this case may be storing a data state $L_1$ having a data value of logical '011'. If the threshold voltage is within the third of the eight threshold voltage ranges $330_2$, the memory cell in this case may be storing a data state $L_2$ having a data value of logical '001', and so on. Table 1 provides one possible correspondence between the data states and their corresponding logical data values. Other assignments of data states to logical data values are known. Memory cells remaining in the lowest data state (e.g., the erased state or L0 data state), as used herein, will be deemed to be programmed to the lowest data state. The information of Table 1 might be contained within the trim register 127, for example.

TABLE 1

| Data State | Logical Data Value |
|---|---|
| L0 | 111 |
| L1 | 011 |
| L2 | 001 |
| L3 | 101 |
| L4 | 100 |
| L5 | 000 |
| L6 | 010 |
| L7 | 110 |

TABLE 1-continued

FIG. 3B is another conceptual depiction of threshold voltage ranges of a plurality of memory cells. FIG. 3B illustrates an example of threshold voltage ranges and their distributions for a population of a sixteen-level memory cells, often referred to as QLC memory cells. For example, such a memory cell might be programmed to a threshold voltage (Vt) that falls within one of sixteen different threshold voltage ranges $330_0$-$330_{15}$, each being used to represent a data state corresponding to a bit pattern of four bits. The threshold voltage range $330_0$ typically has a greater width than the remaining threshold voltage ranges $330_1$-$330_{15}$ as memory cells are generally all placed in the data state corresponding to the threshold voltage range $330_0$, then subsets of those memory cells are subsequently programmed to have threshold voltages in one of the threshold voltage ranges $330_1$-$330_{15}$. As programming operations are generally more incrementally controlled than erase operations, these threshold voltage ranges $330_1$-$330_{15}$ may tend to have tighter distributions.

The threshold voltage ranges $330_0$, $330_1$, $330_2$, $330_3$, $330_4$, $330_5$, $330_6$, $330_7$, $330_8$, $330_9$, $330_{10}$, $330_{11}$, $330_{12}$, $330_{13}$, $330_{14}$ and $330_{15}$ might each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $330_0$, the memory cell in this case may be storing a data state L0 having a data value of logical '1111' and is typically referred to as the erased state of the memory cell. If the threshold voltage is within the second of the sixteen threshold voltage ranges $330_1$, the memory cell in this case may be storing a data state L1 having a data value of logical '0111'. If the threshold voltage is within the third of the sixteen threshold voltage ranges $330_2$, the memory cell in this case may be storing a data state $L_2$ having a data value of logical '0011', and so on. Table 2 provides one possible correspondence between the data states and their corresponding logical data values. Other assignments of data states to logical data values are known. Memory cells remaining in the lowest data state (e.g., the erased state or L0 data state), as used herein, will be deemed to be programmed to the lowest data state. The information of Table 2 might be contained within the trim register 127, for example.

TABLE 2

| Data State | Logical Data Value |
|---|---|
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |

TABLE 2-continued

| Data State | Logical Data Value |
| --- | --- |
| L12 | 1010 |
| L13 | 0010 |
| L14 | 0110 |
| L15 | 1110 |

As memory cells are reduced in size, their associated data storage structures generally become smaller. In addition, as more levels of data states are stored to memory cells, differentiation between data states may become more difficult.

Figure 4A:
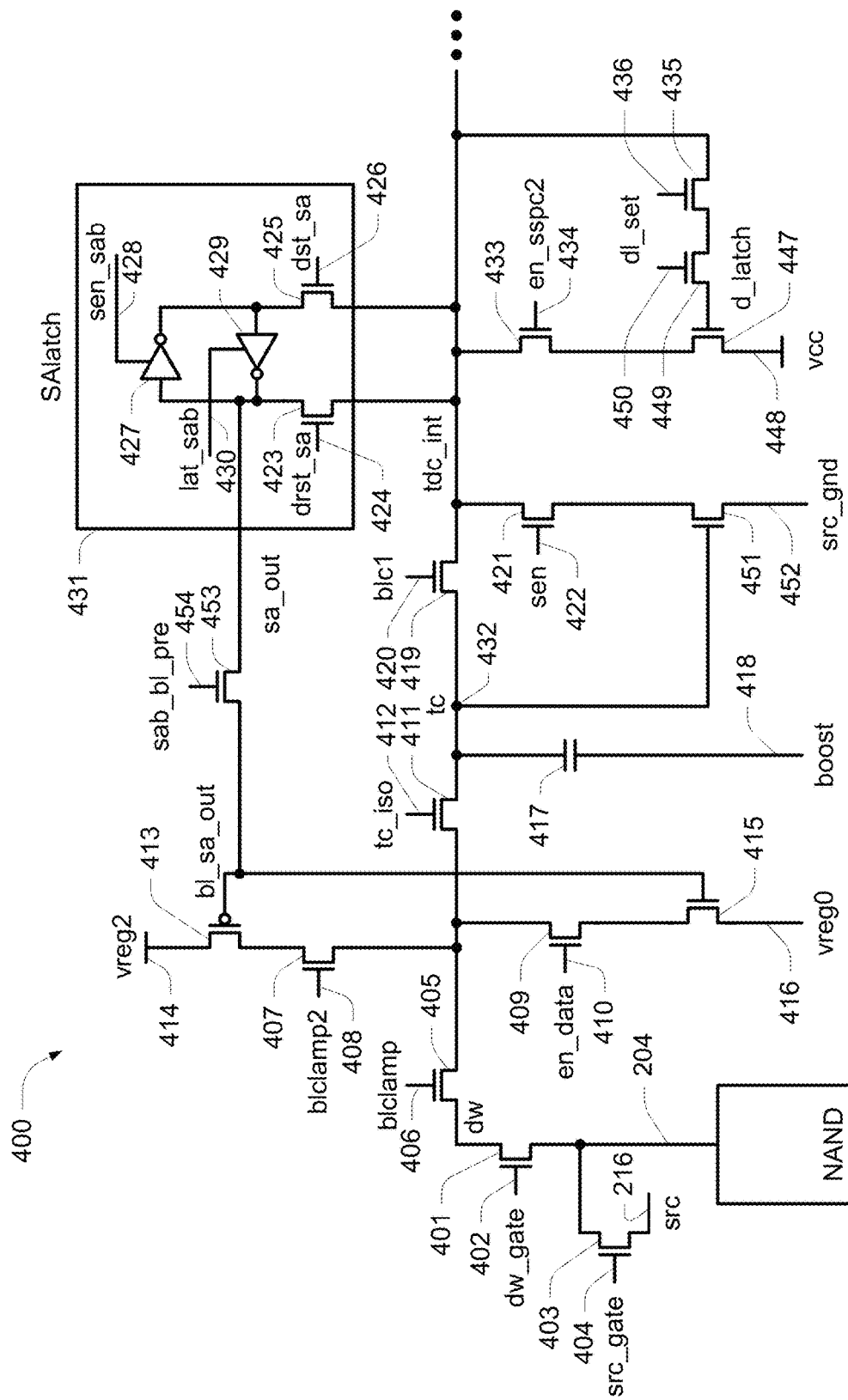
FIGS. 4A-4B are schematics of portions of a page buffer circuit as could be used in a memory of the type described with reference to FIG. 1.
Figure 4B:
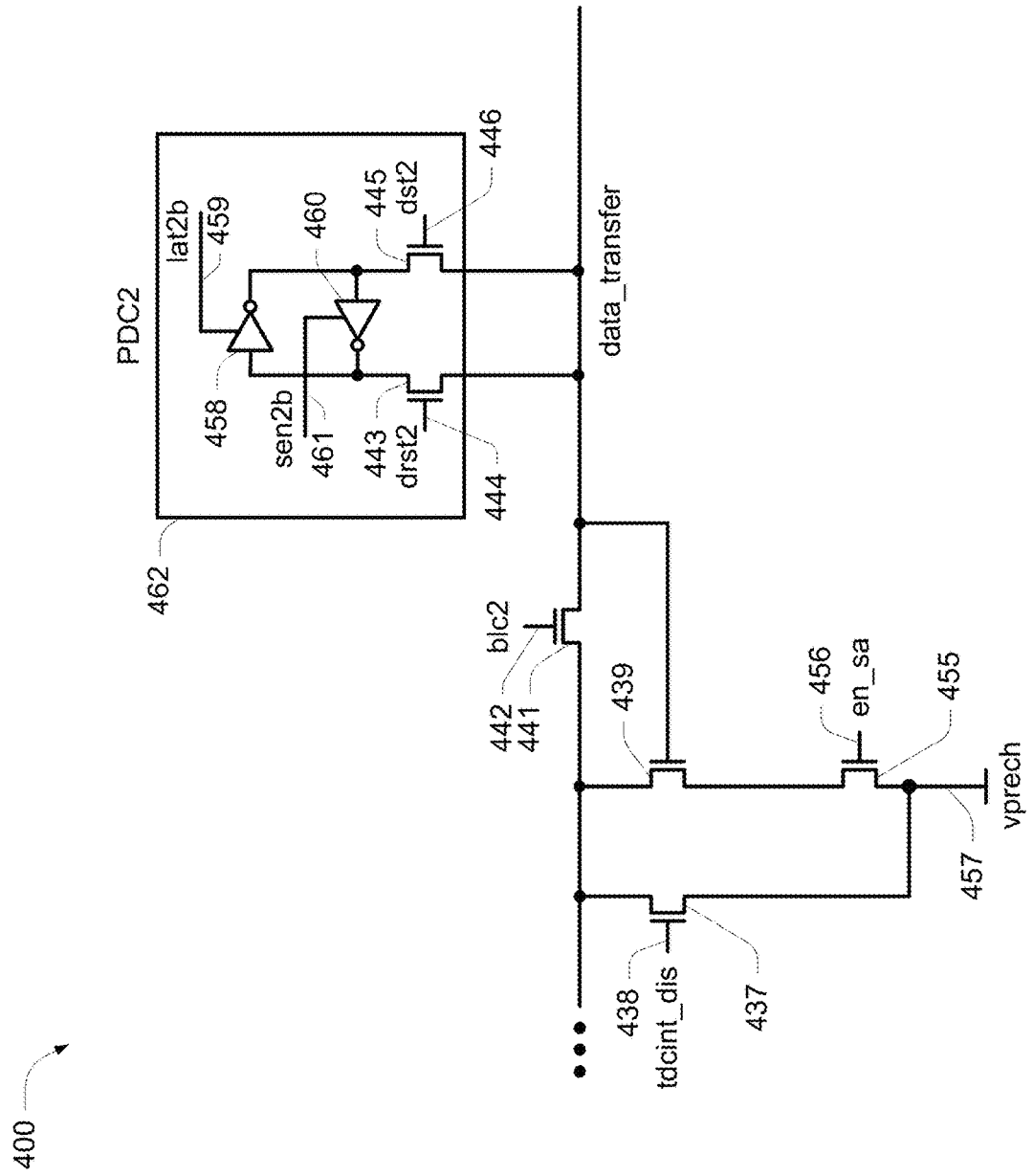

FIGS. 4A-4B are schematics of portions of a page buffer circuit 400 as could be used in a memory of the type described with reference to FIG. 1. Page buffer circuit 400 might be part of buffer portion 240 of FIG. 2C. Page buffer circuit 400 might be connected (e.g., selectively connected) to a NAND string 206 through a data line 204.

Page buffer circuit 400 might include transistors 401, 403, 405, 407, 409, 411, 413, 415, 419, 421, 433, 435, 438, 439, 441, 447, 449, 451, 453, and 455. The page buffer circuit 400 might further include a sense capacitor 417, a sense amplifier latch 431, and a data latch 462. Transistor 413 might be a p-type field-effect transistor (pFET), while transistors 401, 403, 405, 407, 409, 411, 415, 419, 421, 433, 435, 438, 439, 441, 447, 449, 451, 453, and 455 might be n-type field-effect transistors (nFETs). Sense amplifier latch 431 might include inverters 427 and 429 and transistors 423 and 425 (e.g., nFETs). Data latch (e.g., PDC2) 462 might include inverters 458 and 460 and transistors 443 and 445 (e.g., nFETs).

The data line 204 might be connected to a first source/drain of transistor 401 and a first source/drain of transistor 403. The control gate of transistor 403 might be connected to a src_gate control signal node 404. The second source/drain of transistor 403 might be connected to the common source 216. The control gate of transistor 401 might be connected to a dw_gate control signal node 402. The second source/drain of transistor 401 might be connected to a first source/drain of transistor 405.

The control gate of transistor 405 might be connected to a blclamp control signal node 406. The second source/drain of transistor 405 might be connected to a first source/drain of transistor 407, a first source/drain of transistor 409, and a first source/drain of transistor 411. The control gate of transistor 407 might be connected to a blclamp2 control signal node 408. The second source/drain of transistor 407 might be connected to a first source/drain of transistor 413. The control gate of transistor 413 might be connected to a first source/drain of transistor 453 and the control gate of transistor 415. The control gate of transistor 453 might be connected to a sab_bl_pre control signal node 454. The second source/drain of transistor 453 might be connected to the input of inverter 427, the output of inverter 429, and a first source/drain of transistor 423. The second source/drain of transistor 413 might be connected to a voltage node (e.g., vreg2) 414. The control gate of transistor 409 might be connected to an en_data control signal node 410. The second source/drain of transistor 409 might be connected to a first source/drain of transistor 415. The second source/drain of transistor 415 might be connected to a voltage node (e.g., vreg0) 416.

The control gate of transistor 411 might be connected to a tc_iso control signal node 412. The second source/drain of transistor 411 might be connected to one side (e.g., a first electrode) of sense capacitor 417, a first source/drain of transistor 419, and the control gate of transistor 451 through a tc signal node 432. The other side (e.g., a second electrode) of sense capacitor 417 might be connected to a sense capacitor bias node (e.g., boost node) 418. The control gate of transistor 419 might be connected to a blc1 control signal node 420. The second source/drain of transistor 419 might be connected to a first source/drain of transistor 421, the second source/drain of transistor 423, a first source/drain of transistor 425, a first source/drain of transistor 433, a first source/drain of transistor 435, a first source/drain of transistor 437, a first source/drain of transistor 439, and a first source/drain of transistor 441.

The control gate of transistor 433 might be connected to a en_sspc2 control signal node 434. The second source/drain of transistor 433 might be connected to a first source/drain of transistor 447. The second source/drain of transistor 447 might be connected to a voltage node (e.g., vcc) 448. The control gate of transistor 435 might be connected to a dl_set control signal node 436. The second source/drain of transistor 435 might be connected to a first source/drain of transistor 449. The control gate of transistor 449 might be connected to a d_latch control signal node 450. The second source/drain of transistor 449 might be connected to the control gate of transistor 447.

The control gate of transistor 421 might be connected to a sen control signal node 422. The second source/drain of transistor 421 might be connected to a first source/drain of transistor 451. The second source/drain of transistor 451 might be connected to a source bias node (e.g., src_gnd) 452. The transistor 451 might be referred to as a sense transistor.

The control gate of transistor 423 of sense amplifier latch 431 might be connected to a drst_sa control signal node 424. The control gate of transistor 425 might be connected to a dst_sa control signal node 426. The second source/drain of transistor 425 might be connected to the output of inverter 427 and to the input of inverter 429. A control input of inverter 427 might be connected to a sen_sab control signal node 428. A control input of inverter 429 might be connected to a lat_sab control signal node 430.

The control gate of transistor 437 might be connected to a tccint_dis control signal node 438. The second source/drain of transistor 437 might be connected to a first source/drain of transistor 455 and to a voltage node (e.g., vprech) 457. The control gate of transistor 439 might be connected to the second source/drain of transistor 441, a first source/drain of transistor 443, and a first source/drain of transistor 445. The control gate of transistor 441 might be connected to a blc2 control signal node 442. The control gate of transistor 455 might be connected to a en_sa control signal node 456. The second source/drain of transistor 455 might be connected to the second source/drain of transistor 439.

The control gate of transistor 443 of data latch 462 might be connected to a drst2 control signal node 444. The control gate of transistor 445 might be connected to a dst2 control signal node 446. The second source/drain of transistor 443 might be connected to the output of inverter 460 and to the input of inverter 458. The second source/drain of transistor 445 might be connected to the output of inverter 458 and to the input of inverter 460. A control input of inverter 460 might be connected to a sen2b control signal node 461. A control input of inverter 458 might be connected to a lat2b control signal node 459.

Control logic (e.g., 116 of FIG. 1) might be connected to the src_gate control signal node 404, the dw_gate control signal node 402, the blclamp control signal node 406, the blclamp2 control signal node 408, the en_data control signal node 410, the tc_iso control signal node 412, the BLC1 control signal node 420, the sen control signal node 422, the sab_bl_pre control signal node 454, the en_sspc2 control signal node 434, the dl_set control signal node 436, the d_latch control signal node 450, the tdcint_dis control signal node 438, the en_sa control signal node 456, the lat_sab control signal node 430, the sen_sab control signal node 428, the drst_sa control signal node 424, the dst_sa control signal node 426, the sen2b control signal node 461, the lat2b control signal node 459, the drst2 control signal node 444, and the dst2 control signal node 446 to control the operation of page buffer circuit 400.

Page buffer circuit 400 might be used to sense the data state of the selected memory cell of the NAND string 206 and latch the sensed data state in sense amplifier latch 431 during a read operation or a verify phase of a programming operation. Page buffer circuit 400 might also be used to program a target data state to the selected memory cell based on a state of the sense amplifier latch 431 or a state of one or more data latches. Additional data latches (not shown in FIGS. 4A-4B) might be connected in parallel with, and have a similar (e.g., same) structure as, the data latch 462.

Figure 5A:
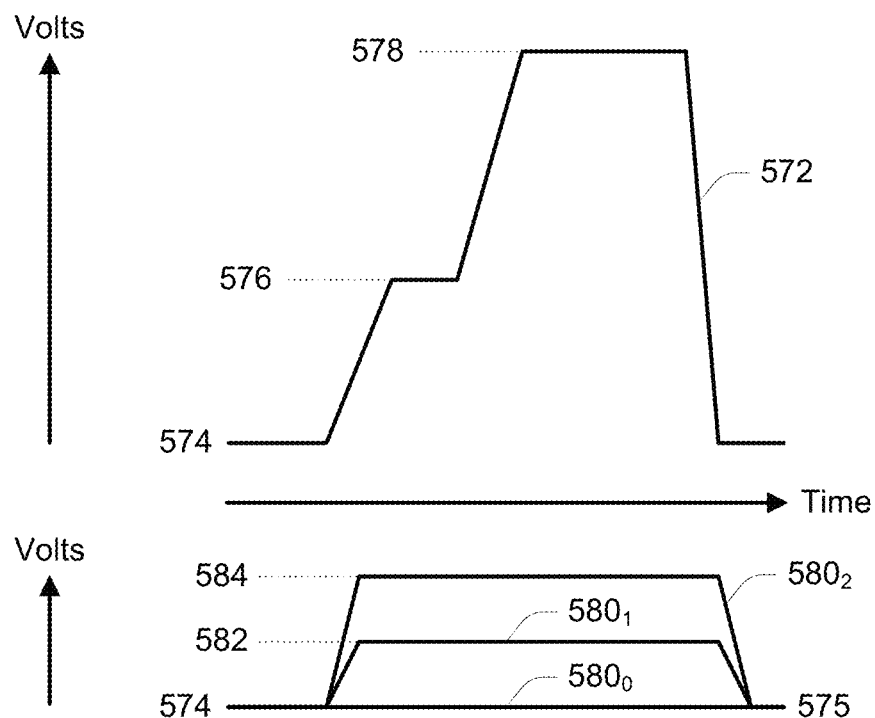
FIG. 5A is a timing diagram depicting voltage levels of data lines and a selected access line for a Single SSPC programming operation.

FIG. 5A is a timing diagram depicting voltage levels of data lines and a selected access line for a Single SSPC programming operation. Trace 572 might represent the voltage level of a selected access line of the Single SSPC programming operation, e.g., the selected access line might be connected to control gates of a plurality of memory cells selected for programming during the programming operation. Trace $580_0$ might represent the voltage level of a data line that is selectively connected to one of the selected memory cells for which programming is to be fully enabled. Trace $580_1$ might represent the voltage level of a data line that is selectively connected to one of the selected memory cells for which programming is to be partially enabled. Trace $580_2$ might represent the voltage level of a data line that is selectively connected to one of the selected memory cells for which programming is to be inhibited.

In FIG. 5A, traces 572, $580_0$, $580_1$, and $580_2$ might have an initial voltage level 574, e.g., a reference potential. The reference potential might be ground, 0V, or the supply voltage Vss, for example. Trace 572 might then be increased to a pass voltage 576. Although not depicted, each unselected access line, e.g., each access line connected to a NAND string other than the selected access line, might also be increased to the pass voltage 576. The pass voltage might be some voltage level configured to activate a memory cell of the NAND string regardless of its data state. Trace 572 might subsequently be increased to a programming voltage 578. Although not depicted, each unselected access line might remain at the pass voltage 576.

Prior to increasing trace 572 to the programming voltage 578, trace $580_2$ might be increased to an inhibit voltage 584 while trace $580_1$ might be increased to an SSPC voltage 582. Trace $580_0$ might remain at the initial voltage level 574, which might also represent an enable voltage 575. Memory cells receiving the programming voltage 578 at their control gates might be expected to have a change (e.g., increase) in threshold voltage dependent upon the level of enablement for programming. For example, a memory cell whose corresponding data line is at the enable voltage 575 might be expected to have a first level of change in threshold voltage, a memory cell whose corresponding data line is at the inhibit voltage 584 might be expected to have no, or a de minimis, change in threshold voltage, and a memory cell whose corresponding data line is at the SSPC voltage 582 might be expected to have a second level of change in threshold voltage that is less than the first level of change, but greater than no change in threshold voltage.

Figure 5B:
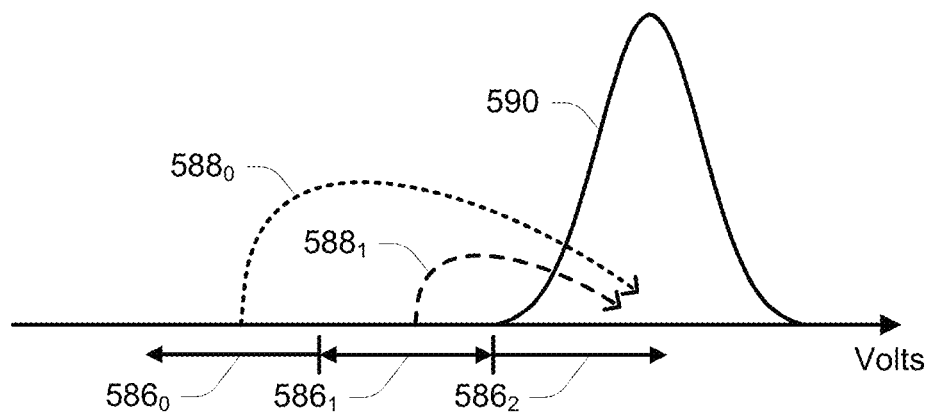
FIG. 5B conceptually depicts the threshold voltage changes for different groupings of memory cells of the programming operation of FIG. 5A.

FIG. 5B conceptually depicts the threshold voltage changes for different groupings of memory cells of the programming operation of FIG. 5A. Memory cells having threshold voltages in the range of threshold voltages $586_0$ might have their corresponding data line configured to receive the enable voltage 575 during programming, and might be expected to experience a first level of change in threshold voltage represented by trace $588_0$ in response to the programming voltage on their control gates. Memory cells having threshold voltages in the range of threshold voltages $586_1$ might have their corresponding data line configured to receive the SSPC voltage 582 during programming, and might be expected to experience a second level of change in threshold voltage represented by trace $588_1$ in response to the programming voltage on their control gates. Memory cells having threshold voltages in the range of threshold voltages $586_2$ might have their corresponding data line configured to receive the inhibit voltage 584 during programming, and might be expected to have no, or a de minimis, change in threshold voltage.

A resulting distribution of threshold voltages 590 might be expected to be more narrow than a programming operation not utilizing SSPC techniques. For example, if memory cells having threshold voltages in the range of threshold voltages $586_1$ had their corresponding data line configured to receive the enable voltage 575 during programming, they might be expected to experience the first level of change in threshold voltage $588_0$ in response to the programming voltage on their control gates, which might be expected to lead to a widening of the distribution of threshold voltages versus those memory cells experiencing the second level of change in threshold voltage $588_1$.

Figure 6A:
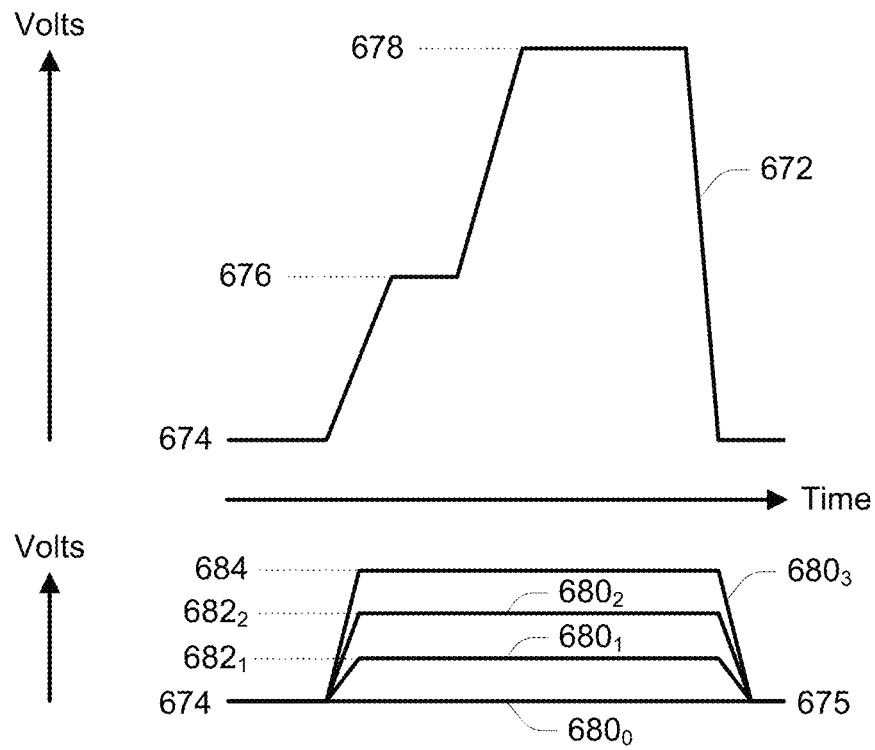
FIG. 6A is a timing diagram depicting voltage levels of data lines and a selected access line for a Dual SSPC programming operation.

FIG. 6A is a timing diagram depicting voltage levels of data lines and a selected access line for a Dual SSPC programming operation. Trace 672 might represent the voltage level of a selected access line of the Dual SSPC programming operation, e.g., the selected access line might be connected to control gates of a plurality of memory cells selected for programming during the programming operation. Trace $680_0$ might represent the voltage level of a data line that is selectively connected to one of the selected memory cells for which programming is to be fully enabled. Trace $680_1$ might represent the voltage level of a data line that is selectively connected to one of the selected memory cells for which programming is to be partially enabled to a first level. Trace $680_2$ might represent the voltage level of a data line that is selectively connected to one of the selected memory cells for which programming is to be partially enabled to a second level, lesser enabled than the first level. Trace $680_3$ might represent the voltage level of a data line that is selectively connected to one of the selected memory cells for which programming is to be inhibited.

In FIG. 6A, traces 672, $680_0$, $680_1$, $680_2$, and $680_3$ might have an initial voltage level 674, e.g., a reference potential. The reference potential might be ground, 0V, or the supply voltage Vss, for example. Trace 672 might then be increased to a pass voltage 676. Although not depicted, each unselected access line, e.g., each access line connected to a NAND string other than the selected access line, might also be increased to the pass voltage 676. The pass voltage might be some voltage level configured to activate a memory cell of the NAND string regardless of its data state. Trace 672 might subsequently be increased to a programming voltage 678. Although not depicted, each unselected access line might remain at the pass voltage 676.

Prior to increasing trace 672 to the programming voltage 678, trace 680$_3$ might be increased to an inhibit voltage 684 while trace 680$_1$ might be increased to a first SSPC voltage 682$_1$ and trace 680$_2$ might be increased to a second SSPC voltage 682$_2$. Trace 680$_0$ might remain at the initial voltage level 674, which might also represent an enable voltage 675. Memory cells receiving the programming voltage 678 at their control gates might be expected to have a change (e.g., increase) in threshold voltage dependent upon the level of enablement for programming. For example, a memory cell whose corresponding data line is at the enable voltage 675 might be expected to have a first level of change in threshold voltage, a memory cell whose corresponding data line is at the inhibit voltage 684 might be expected to have no, or a de minimis, change in threshold voltage, a memory cell whose corresponding data line is at the first SSPC voltage 682$_1$ might be expected to have a second level of change in threshold voltage that is less than the first level of change, but greater than no change in threshold voltage, and a memory cell whose corresponding data line is at the second SSPC voltage 682$_2$ might be expected to have a third level of change in threshold voltage that is less than the second level of change, but greater than no change in threshold voltage.

Figure 6B:
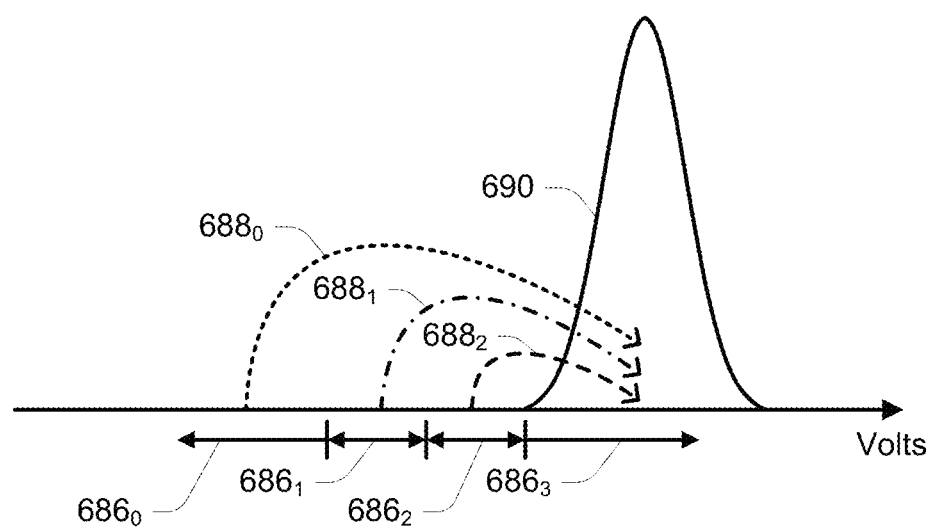
FIG. 6B conceptually depicts the threshold voltage changes for different groupings of memory cells of the programming operation of FIG. 6A.

FIG. 6B conceptually depicts the threshold voltage changes for different groupings of memory cells of the programming operation of FIG. 6A. Memory cells having threshold voltages in the range of threshold voltages 686$_0$ might have their corresponding data line configured to receive the enable voltage 675 during programming, and might be expected to experience a first level of change in threshold voltage represented by trace 688$_0$ in response to the programming voltage on their control gates. Memory cells having threshold voltages in the range of threshold voltages 686$_1$ might have their corresponding data line configured to receive the first SSPC voltage 682$_1$ during programming, and might be expected to experience a second level of change in threshold voltage represented by trace 688$_1$ in response to the programming voltage on their control gates. Memory cells having threshold voltages in the range of threshold voltages 686$_2$ might have their corresponding data line configured to receive the second SSPC voltage 682$_2$ during programming, and might be expected to experience a third level of change in threshold voltage represented by trace 688$_2$ in response to the programming voltage on their control gates. Memory cells having threshold voltages in the range of threshold voltages 686$_3$ might have their corresponding data line configured to receive the inhibit voltage 684 during programming, and might be expected to have no, or a de minimis, change in threshold voltage.

A resulting distribution of threshold voltages 690 might be expected to be more narrow than the distribution of threshold voltages 590 of the Single SSPC programming operation using a same set of programming voltages. For example, as memory cells having threshold voltages closer to the range of threshold voltages 686$_3$ are configured to experience smaller changes in threshold voltages, narrower distributions of threshold voltages might be attained. While the Dual SSPC programming operation provides the benefit of a narrower distribution of threshold voltages over the Single SSPC programming operation, the Dual SSPC programming operation generally requires the identification of an additional range of threshold voltages over the Single SSPC programming operation and is thus generally more time consuming.

Figure 7A:
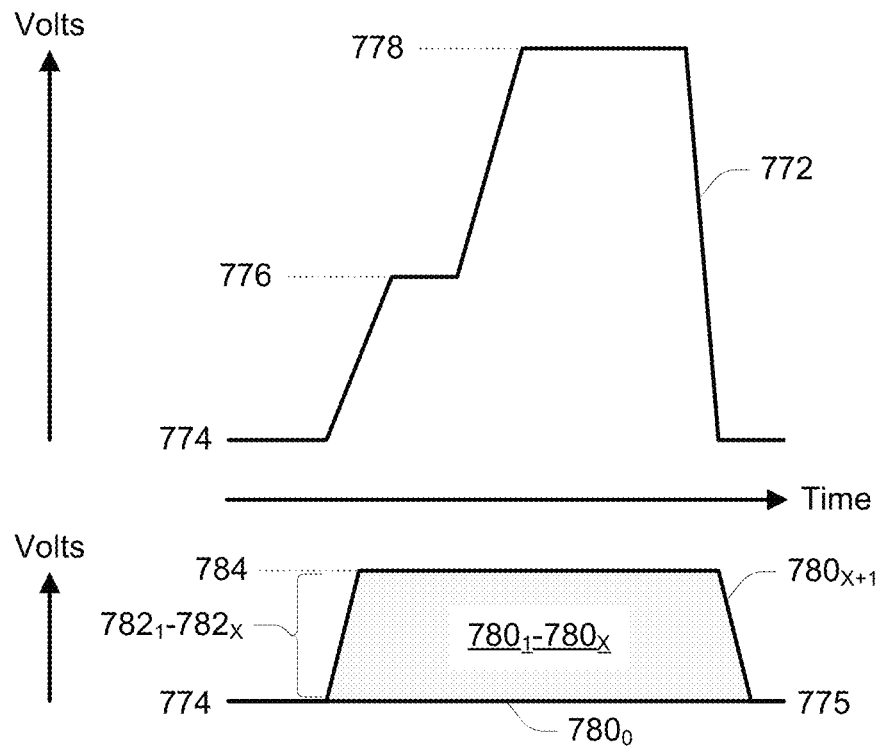
FIG. 7A is a timing diagram depicting voltage levels of data lines and a selected access line for a programming operation in accordance with an embodiment.

FIG. 7A is a timing diagram depicting voltage levels of data lines and a selected access line for a programming operation in accordance with an embodiment, which might be referred to herein as Analog SSPC. For example, each memory cell not intended to be fully enabled for programming or inhibited from programming, might have a respective SSPC voltage level applied to its corresponding data line during programming that is higher than the enable voltage and lower than the inhibit voltage. Note that the use of positive voltage levels for an enable voltage are known, such that the enable voltage need not be the reference potential.

The respective SSPC voltage for a memory cell might have an inverse relationship with the I$_{string}$ current level of that memory cell during a verify phase of the programming operation. For example, memory cells exhibiting higher current levels during the verify phase of the programming operation might be expected to have their corresponding data line at a voltage level closer to the enable voltage for a subsequent programming pulses than memory cells exhibiting lower current levels during the verify phase of the programming operation.

Trace 772 might represent the voltage level of a selected access line of the Analog SSPC programming operation, e.g., the selected access line might be connected to control gates of a plurality of memory cells selected for programming during the programming operation. Trace 780$_0$ might represent the voltage level of a data line that is selectively connected to one of the selected memory cells for which programming is to be fully enabled. The shaded traces 780$_1$-780$_X$ might represent the voltage levels of data lines that are selectively connected to one of the selected memory cells for which programming is to be partially enabled to one of a plurality of levels. Trace 780$_{X+1}$ might represent the voltage level of a data line that is selectively connected to one of the selected memory cells for which programming is to be inhibited.

In FIG. 7A, traces 772 and 780$_0$-780$_{X+1}$ might have an initial voltage level 774, e.g., a reference potential. The reference potential might be ground, 0V, or the supply voltage Vss, for example. Trace 772 might then be increased to a pass voltage 776. Although not depicted, each unselected access line, e.g., each access line connected to a NAND string other than the selected access line, might also be increased to the pass voltage 776. The pass voltage might be some voltage level configured to activate a memory cell of the NAND string regardless of its data state. Trace 772 might subsequently be increased to a programming voltage 778. Although not depicted, each unselected access line might remain at the pass voltage 776.

Prior to increasing trace 772 to the programming voltage 778, trace 780$_{X+1}$ might be increased to an inhibit voltage 784, while traces 780$_1$-780$_X$ might be increased to their respective SSPC voltages 782$_1$-780$_X$. Trace 780$_0$ might remain at the initial voltage level 774, which might also represent an enable voltage 775. Memory cells receiving the programming voltage 778 at their control gates might be expected to have a change (e.g., increase) in threshold voltage dependent upon the level of enablement for programming. For example, a memory cell whose corresponding data line is at the enable voltage 775 might be expected to have a first level of change in threshold voltage, a memory cell whose corresponding data line is at the inhibit voltage 784 might be expected to have no, or a de minimis, change in threshold voltage, and a memory cell whose corresponding data line is at one of the SSPC voltages 782$_1$-782$_X$ might be expected to have one of a number of different levels of change in threshold voltage that are each less than (e.g., less than or equal to) the first level of change, and greater than (e.g., greater than or equal to) no change in threshold voltage.

Figure 7B:
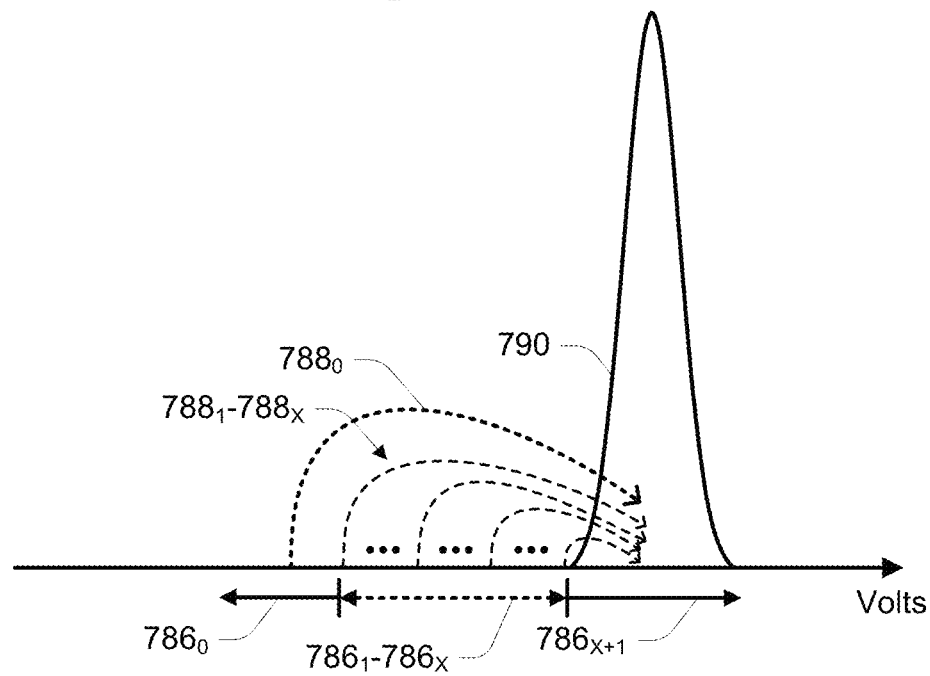
FIG. 7B conceptually depicts the threshold voltage changes for different groupings of memory cells of the programming operation of FIG. 7A.

FIG. 7B conceptually depicts the threshold voltage changes for different groupings of memory cells of the programming operation of FIG. 7A. Memory cells having threshold voltages in the range of threshold voltages $786_0$ might have their corresponding data line configured to receive the enable voltage 775 during programming, and might be expected to experience a first level of change in threshold voltage represented by trace $788_0$ in response to the programming voltage on their control gates. Memory cells having threshold voltages in the range of threshold voltages $786_1$-$786_X$ might have their corresponding data lines configured to receive one of the SSPC voltages $782_1$-$782_X$ during programming, and might be expected to experience one of a number of different levels of change in threshold voltage represented by traces $788_1$-$788_X$ in response to the programming voltage on their control gates. Memory cells having threshold voltages in the range of threshold voltages $786_{X+1}$ might have their corresponding data line configured to receive the inhibit voltage 784 during programming, and might be expected to have no, or a de minimis, change in threshold voltage.

A resulting distribution of threshold voltages 790 might be expected to be more narrow than the distribution of threshold voltages 690 of the Dual SSPC programming operation using a same set of programming voltages. For example, embodiments herein can set an SSPC voltage for each memory cell that is to be partially enabled for programming in response to its own threshold voltage rather than assigning each to different ranges of threshold voltages. In addition, as will be described in more detail infra, embodiments described herein do not need to identify additional ranges of threshold voltages over a Single SSPC programming operation, thus providing certain efficiencies as well.

Figure 8:
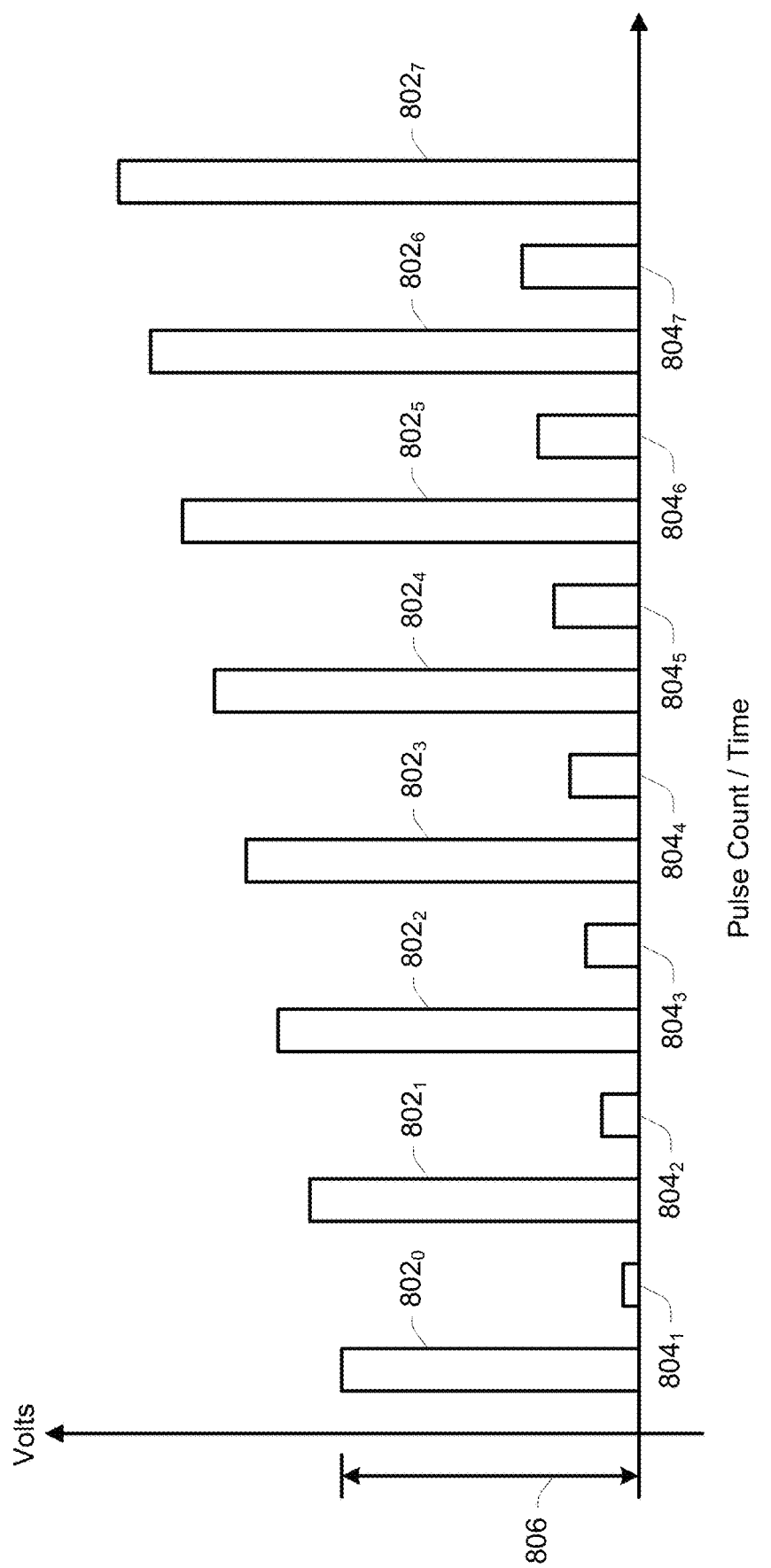
FIG. 8 shows a plot of an access line voltage versus time of a programming operation in accordance with embodiments.

FIG. 8 shows a plot of an access line voltage versus time of a programming operation in accordance with embodiments. Depicted in FIG. 8 is a series of programming pulses 802 (e.g., programming pulses $802_0$-$802_7$), which might each be followed by a verify pulse 804 (e.g., verify pulses $804_0$-$804_7$). FIG. 8 might correspond to a programming operation for a TLC memory, programming memory cells to one of eight different threshold voltage distributions such as depicted in FIG. 3A. Although seven programming pulses 802 are depicted in FIG. 8, programming operations might utilize different numbers (e.g., greater numbers) of programming pulses 802.

In FIG. 8, the programming pulses 802 are depicted to have a programming start voltage, e.g., of an initial programming pulse $802_0$, having a voltage level 806. Each subsequent programming pulse might be higher than its immediately prior programming pulse 802. During the programming pulse $802_0$, each memory cell selected for programming to any data state of a plurality of data states for the programming operation other than a lowest (e.g., erased or L0) data state might be fully enabled for programming. That is, their corresponding data lines might be configured to receive an enable voltage level for the programming operation during the programming pulse $802_0$. The L0 memory cells might be inhibited from programming during the programming pulse $802_0$. That is, their corresponding data lines might be configured to receive an inhibit voltage level for the programming operation during the programming pulse $802_0$. The L0 memory cells might further be inhibited from programming for each remaining programming pulse $802_1$-$802_7$.

Following the programming pulse $802_0$ in a programming phase of the programming operation, a verify pulse $804_1$ might be applied in a verify phase of the programming operation. The verify pulse $804_1$ might have a voltage level corresponding to a lowest threshold voltage for the L1 data state, e.g., the threshold voltage distribution $303_1$. During this verify phase, a value of VgVt might be determined (e.g., estimated) for memory cells having the $L_1$ data state as their intended data state. The value of VgVt represents a difference between the applied voltage level across a memory cell and its resulting threshold voltage. For example, if a voltage level of 13 volts is applied to a control gate of a memory cell whose body (e.g., channel) is at a ground potential (e.g., 0 volts), and the resulting threshold voltage is −0.5 volt, the VgVt for that memory cell is (13 volts−0 volts)−(−0.5 volts)=13.5 volts. From the value of VgVt for a group of memory cells (e.g., the memory cells selected for programming that have not yet verified), a voltage level of a subsequent programming pulse, e.g., programming pulse $802_1$, might be determined that is deemed sufficient to move a fully enabled $L_1$ memory cell to the desired threshold voltage or above, e.g., higher than or equal to the voltage level of the verify pulse $804_1$. For example, a representative threshold voltage for a group of memory cells might be determined. The representative threshold voltage might represent a median of an expected normal distribution of the threshold voltages of the memory cells following the prior programming pulse, which might be determined or estimated in manners well understood in the relevant art. A value of VgVt could be determined from the voltage level of the prior programming pulse and the resulting representative threshold voltage of the group of memory cells, and a voltage level of a subsequent programming pulse could be determined in response to the value of VgVt and the desired threshold voltage (e.g., desired minimum and/or maximum threshold voltage) of the L1 memory cells.

Following the verify pulse $804_1$, the programming pulse $802_1$ might be applied in a programming phase of the programming operation. During the programming pulse $802_1$, each memory cell selected for programming to any data state of the plurality of data states for the programming operation higher than the L1 data state might be fully enabled for programming. The L1 memory cells might be inhibited from programming, fully enabled for programming, or partially enabled for programming as determined during the verify phase of the programming operation using the verify pulse $804_1$. The L1 memory cells might be subsequently inhibited from programming for each remaining programming pulse $802_2$-$802_7$.

Following the programming pulse $802_1$, a verify pulse $804_2$ might be applied in a verify phase of the programming operation. The verify pulse $804_2$ might have a voltage level corresponding to a lowest threshold voltage for the L2 data state, e.g., the threshold voltage distribution $303_2$. During this verify phase, a value of VgVt might be determined (e.g., estimated) for memory cells having the L2 data state as their intended data state. From this value of VgVt, a voltage level of a subsequent programming pulse, e.g., programming pulse $802_2$, might be determined that is deemed sufficient to move a fully enabled L2 memory cell to the desired threshold voltage or above, e.g., higher than or equal to the voltage level of the verify pulse $804_2$.

Following the verify pulse $804_2$, the programming pulse $802_2$ might be applied in a programming phase of the programming operation. During the programming pulse $802_2$, each memory cell selected for programming to any data state of the plurality of data states for the programming operation higher than the L2 data state might be fully enabled for programming. The L2 memory cells might be inhibited from programming, fully enabled for programming, or partially enabled for programming as determined during the verify phase of the programming operation using the verify pulse $804_2$. The L2 memory cells might be subsequently inhibited from programming for each remaining programming pulse $802_3$-$802_7$.

Following the programming pulse $802_2$, a verify pulse $804_3$ might be applied in a verify phase of the programming operation. The verify pulse $804_3$ might have a voltage level corresponding to a lowest threshold voltage for the L3 data state, e.g., the threshold voltage distribution $303_3$. During this verify phase, a value of VgVt might be determined (e.g., estimated) for memory cells having the L3 data state as their intended data state. From this value of VgVt, a voltage level of a subsequent programming pulse, e.g., programming pulse $802_3$, might be determined that is deemed sufficient to move a fully enabled L3 memory cell to the desired threshold voltage or above, e.g., higher than or equal to the voltage level of the verify pulse $804_3$.

Following the verify pulse $804_3$, the programming pulse $802_3$ might be applied in a programming phase of the programming operation. During the programming pulse $802_3$, each memory cell selected for programming to any data state of the plurality of data states for the programming operation higher than the L3 data state might be fully enabled for programming. The L3 memory cells might be inhibited from programming, fully enabled for programming, or partially enabled for programming as determined during the verify phase of the programming operation using the verify pulse $804_3$. The L3 memory cells might be subsequently inhibited from programming for each remaining programming pulse $802_4$-$802_7$.

Following the programming pulse $802_3$, a verify pulse $804_4$ might be applied in a verify phase of the programming operation. The verify pulse $804_4$ might have a voltage level corresponding to a lowest threshold voltage for the L4 data state, e.g., the threshold voltage distribution $303_4$. During this verify phase, a value of VgVt might be determined (e.g., estimated) for memory cells having the L4 data state as their intended data state. From this value of VgVt, a voltage level of a subsequent programming pulse, e.g., programming pulse $802_4$, might be determined that is deemed sufficient to move a fully enabled L4 memory cell to the desired threshold voltage or above, e.g., higher than or equal to the voltage level of the verify pulse $804_4$.

Following the verify pulse $804_4$, the programming pulse $802_4$ might be applied in a programming phase of the programming operation. During the programming pulse $802_4$, each memory cell selected for programming to any data state of the plurality of data states for the programming operation higher than the L4 data state might be fully enabled for programming. The L4 memory cells might be inhibited from programming, fully enabled for programming, or partially enabled for programming as determined during the verify phase of the programming operation using the verify pulse $804_4$. The L4 memory cells might be subsequently inhibited from programming for each remaining programming pulse $802_5$-$802_7$.

Following the programming pulse $802_4$, a verify pulse $804_5$ might be applied in a verify phase of the programming operation. The verify pulse $804_5$ might have a voltage level corresponding to a lowest threshold voltage for the L5 data state, e.g., the threshold voltage distribution $303_5$. During this verify phase, a value of VgVt might be determined (e.g., estimated) for memory cells having the L5 data state as their intended data state. From this value of VgVt, a voltage level of a subsequent programming pulse, e.g., programming pulse $802_5$, might be determined that is deemed sufficient to move a fully enabled L5 memory cell to the desired threshold voltage or above, e.g., higher than or equal to the voltage level of the verify pulse $804_5$.

Following the verify pulse $804_5$, the programming pulse $802_5$ might be applied in a programming phase of the programming operation. During the programming pulse $802_5$, each memory cell selected for programming to any data state of the plurality of data states for the programming operation higher than the L5 data state might be fully enabled for programming. The L5 memory cells might be inhibited from programming, fully enabled for programming, or partially enabled for programming as determined during the verify phase of the programming operation using the verify pulse $804_5$. The L5 memory cells might be subsequently inhibited from programming for each remaining programming pulse $802_6$-$802_7$.

Following the programming pulse $802_5$, a verify pulse $804_6$ might be applied in a verify phase of the programming operation. The verify pulse $804_6$ might have a voltage level corresponding to a lowest threshold voltage for the L6 data state, e.g., the threshold voltage distribution $303_6$. During this verify phase, a value of VgVt might be determined (e.g., estimated) for memory cells having the L6 data state as their intended data state. From this value of VgVt, a voltage level of a subsequent programming pulse, e.g., programming pulse $802_6$, might be determined that is deemed sufficient to move a fully enabled L6 memory cell to the desired threshold voltage or above, e.g., higher than or equal to the voltage level of the verify pulse $804_6$.

Following the verify pulse $804_6$, the programming pulse $802_6$ might be applied in a programming phase of the programming operation. During the programming pulse $802_6$, each memory cell selected for programming to any data state of the plurality of data states for the programming operation higher than the L6 data state might be fully enabled for programming. The L6 memory cells might be inhibited from programming, fully enabled for programming, or partially enabled for programming as determined during the verify phase of the programming operation using the verify pulse $804_6$. The L6 memory cells might be subsequently inhibited from programming for the remaining programming pulse $802_7$.

Following the programming pulse $802_6$, a verify pulse $804_7$ might be applied in a verify phase of the programming operation. The verify pulse $804_7$ might have a voltage level corresponding to a lowest threshold voltage for the L7 data state, e.g., the threshold voltage distribution $303_7$. During this verify phase, a value of VgVt might be determined (e.g., estimated) for memory cells having the L7 data state as their intended data state. From this value of VgVt, a voltage level of a subsequent programming pulse, e.g., programming pulse $802_7$, might be determined that is deemed sufficient to move a fully enabled L7 memory cell to the desired threshold voltage or above, e.g., higher than or equal to the voltage level of the verify pulse $804_7$.

Following the verify pulse $804_7$, the programming pulse $802_7$ might be applied in a programming phase of the programming operation. During the programming pulse $802_7$, the L7 memory cells might be inhibited from programming, fully enabled for programming, or partially enabled for programming as determined during the verify phase of the programming operation using the verify pulse $804_7$.

It is recognized that presuming memory cells to have reached their desired threshold voltages without further verification might result in memory cells having threshold voltages below their desired threshold voltages. However, the number of such memory cells might be expected to be small given the relatively small change in threshold voltage necessary for each data state, and error correction schemes are generally capable of correcting such erroneous data.

Figure 9:
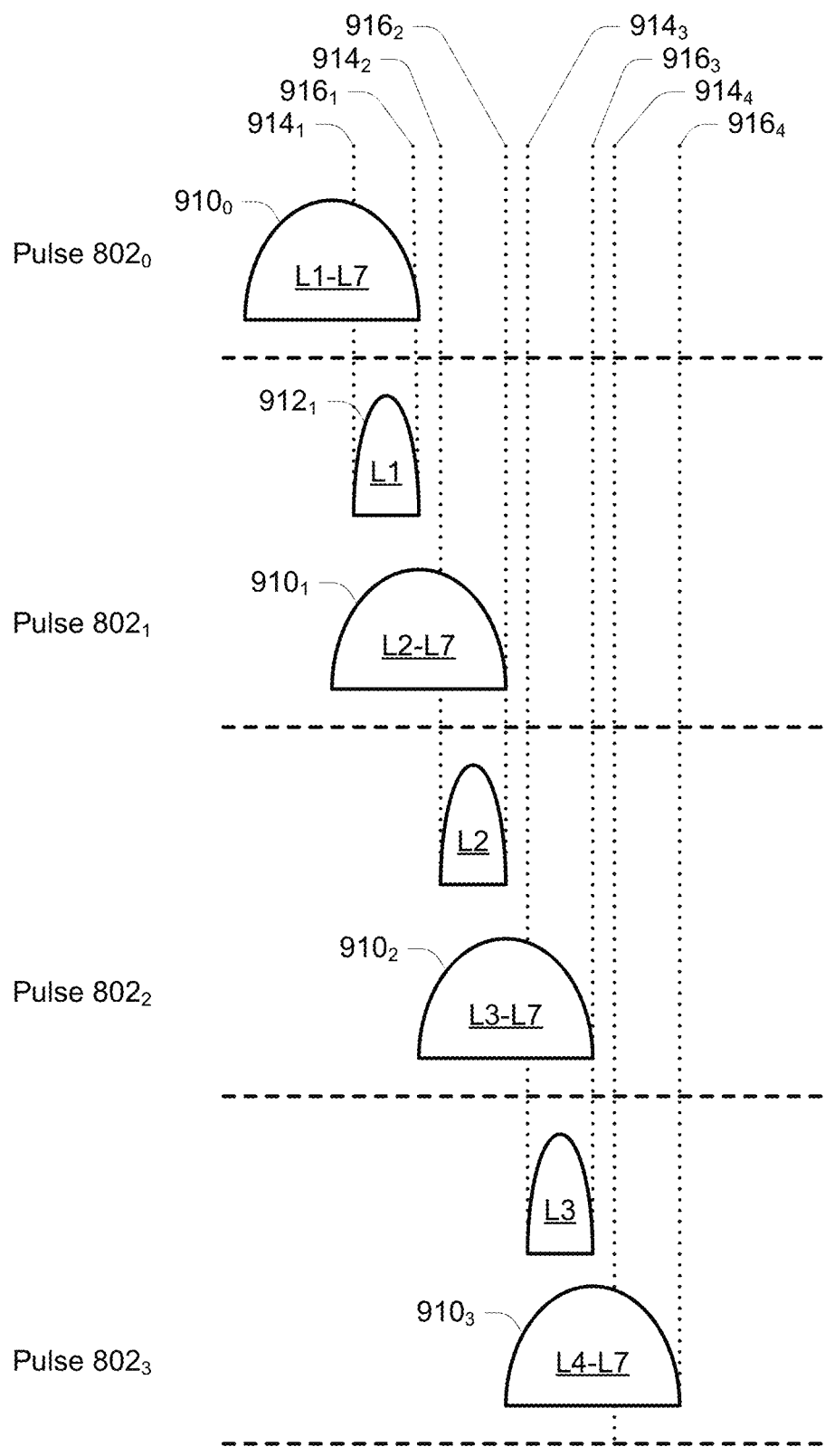
FIG. 9 is a conceptual depiction of a verify phase of the programming operation of FIG. 8.

FIG. 9 is a conceptual depiction of the programming operation of FIG. 8. Following application of the programming pulse $802_0$, a threshold voltage distribution $910_0$ might result containing memory cells having the intended data states L1-L7. An upper voltage level of the threshold voltage distribution $910_0$ might be lower than or equal to an upper voltage level of the L1 data state, or L1_max. This might be accomplished by selecting a voltage level of the programming pulse $802_0$, Vpgm_init, satisfying the following equation:

$$Vpgm\_init - VgVt + 3PVS < L1\_max \qquad \text{Eq. 1}$$

In Equation 1, the value of VgVt might correspond to a representative value of VgVt for the memory cells selected for programming, which might, for example, be predetermined experimentally, empirically or through simulation based on known characteristics (e.g., intrinsic properties) of the memory cells. The value of PVS might correspond to a value (in volt unit per sigma) of one standard deviation (e.g., one sigma of a normal distribution of threshold voltages of the memory cells) responsive to a programming pulse. The value of PVS might, for example, be predetermined experimentally, empirically or through simulation based on known characteristics (e.g., intrinsic properties) of the memory cells. The value of L1_max might be predetermined, and might be equal to a voltage level of the verify pulse $804_1$ plus a desired state width for the L1 data state, e.g., the width of the threshold voltage distribution $330_1$ of FIG. 3A. Note that the desired state width for each data state other than L0 might have a same value. Alternatively, desired state widths could be independently defined.

The voltage level of the programming pulse $802_1$ might be determined as a sum of the voltage level of the prior programming pulse, e.g., Vpgm_init, plus a step voltage level, e.g., Vpgm_step, satisfying the following equation:

$$Vpgm\_step > 7PVS - SW \qquad \text{Eq. 2}$$

In Equation 2, the value of SW might correspond to the desired state width for the L1 data state. Alternatively, the voltage level of the programming pulse $802_1$ might be determined in a similar manner as used for the programming pulse $802_0$, modifying Equation 1 to use a value of VgVt determined in response to applying the verify pulse $804_1$, and replacing L1_max with an upper voltage level of the L2 data state, or L2_max. The value of L2_max might be predetermined, and might be equal to a voltage level of the verify pulse $804_2$ plus a desired state width for the L2 data state, e.g., the width of the threshold voltage distribution $330_2$ of FIG. 3A. Memory cells having a desired data state of L1 might be enabled (e.g., fully enabled or partially enabled) for programming, or inhibited from programming, for the programming pulse $802_1$ depending upon their level of activation in response to applying the verify pulse $804_1$. Memory cells having a desired data state of L2 or higher might be enabled (e.g., fully enabled) for programming for the programming pulse $802_1$.

Following application of the programming pulse $802_1$, a threshold voltage distribution $910_1$ might result containing memory cells having the intended data states L2-L7, and a threshold voltage distribution $912_1$ might result containing memory cells having the intended data state L1. The programming pulse $802_1$ thus might be considered a fine programming pulse for the L1 memory cells, and a sampling pulse for the L2 memory cells. The threshold voltage distribution $912_1$ might have a lower voltage level $914_1$ and an upper voltage level $916_1$, and might correspond to the threshold voltage distribution $330_1$. The lower voltage level $914_1$ might correspond to the voltage level of the verify pulse $804_1$.

The voltage level of the programming pulse $802_2$ might be determined as a sum of the voltage level of the prior programming pulse plus a step voltage level, using the voltage level of the programming pulse $802_1$ as the prior programming pulse, and using the state width of the L3 data state. Alternatively, the voltage level of the programming pulse $802_2$ might be determined in response to a value of VgVt determined in response to applying the verify pulse $804_2$, and using an upper voltage level of the L3 data state as the limit. Memory cells having a desired data state of L2 might be enabled (e.g., fully enabled or partially enabled) for programming, or inhibited from programming, for the programming pulse $802_2$ depending upon their level of activation in response to applying the verify pulse $804_2$. Memory cells having a desired data state of L3 or higher might be enabled (e.g., fully enabled) for programming for the programming pulse $802_2$.

Following application of the programming pulse $802_2$, a threshold voltage distribution $910_2$ might result containing memory cells having the intended data states L3-L7, and a threshold voltage distribution $912_2$ might result containing memory cells having the intended data state L2. The programming pulse $802_2$ thus might be considered a fine programming pulse for the L2 memory cells, and a sampling pulse for the L3 memory cells. The threshold voltage distribution $912_2$ might have a lower voltage level $914_2$ and an upper voltage level $916_2$, and might correspond to the threshold voltage distribution $330_2$. The lower voltage level $914_2$ might correspond to the voltage level of the verify pulse $804_2$.

The voltage level of the programming pulse $802_3$ might be determined as a sum of the voltage level of the prior programming pulse plus a step voltage level, using the voltage level of the programming pulse $802_2$ as the prior programming pulse, and using the state width of the L4 data state. Alternatively, the voltage level of the programming pulse $802_3$ might be determined in response to a value of VgVt determined in response to applying the verify pulse $804_3$, and using an upper voltage level of the L4 data state as the limit. Memory cells having a desired data state of L3 might be enabled (e.g., fully enabled or partially enabled) for programming, or inhibited from programming, for the programming pulse $802_3$ depending upon their level of activation in response to applying the verify pulse $804_3$. Memory cells having a desired data state of L4 or higher might be enabled (e.g., fully enabled) for programming for the programming pulse $802_3$.

Following application of the programming pulse $802_3$, a threshold voltage distribution $910_3$ might result containing memory cells having the intended data states L4-L7, and a threshold voltage distribution $912_3$ might result containing memory cells having the intended data state L3. The programming pulse $802_3$ thus might be considered a fine programming pulse for the L3 memory cells, and a sampling pulse for the L4 memory cells. The threshold voltage distribution $912_3$ might have a lower voltage level $914_3$ and an upper voltage level $916_3$, and might correspond to the threshold voltage distribution $330_3$. The lower voltage level $914_3$ might correspond to the voltage level of the verify pulse $804_3$. This process might be continued in a like manner for each remaining programming pulse 802.

Figure 10:
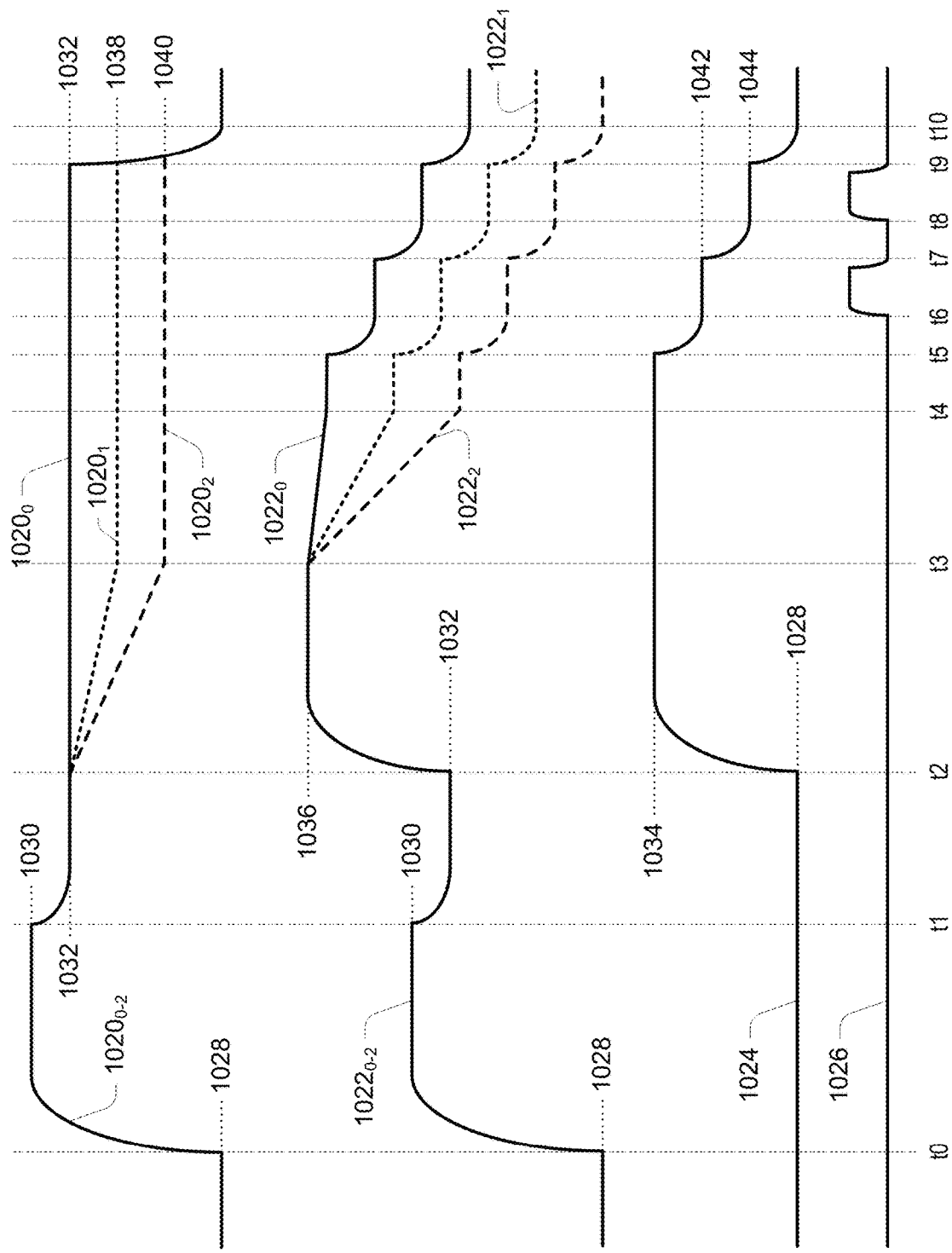
FIG. 10 is a timing diagram generally depicting voltage levels of various nodes of a page buffer circuit at various stages of a verify phase of a programming operation in accordance with an embodiment.

FIG. 10 is a timing diagram generally depicting voltage levels of various nodes of a page buffer circuit such as the page buffer circuit 400 depicted in FIGS. 4A-4B at various stages of a verify phase of a programming operation in accordance with an embodiment. FIG. 10 provides detail of a portion of a verify phase that might be used with embodiments. Traces $1020_0$, $1020_1$, and $1020_2$ might each represent a respective voltage level of a data line 204 corresponding to a memory cell having a first $I_{string}$ value, a second $I_{string}$ value higher than the first $I_{string}$ value, and a third $I_{string}$ value higher than the second $I_{string}$ value, respectively, during the verify phase of the programming operation. Traces $1022_0$, $1022_1$, and $1022_2$ might each represent a respective voltage level of a tc signal node 432 corresponding to the data line 204 of traces $1020_0$, $1020_1$, and $1020_2$, respectively. Trace 1024 might represent the voltage level of the boost node 418. Trace 1026 might represent the voltage level of the sen control signal node 422.

With regard to FIG. 10, a precharge portion of the verify phase of the programming operation might begin at time t0 by precharging the tc signal node 432 and the data line 204 from an initial voltage level 1028 to a voltage level 1030. For example, the tc signal node 432 and data line 204 might be connected to the vreg2 voltage node 414, the sense amplifier latch 431, or the vprech voltage node 457. The voltage level 1030 might be higher than the inhibit voltage Vinh for the programming operation. The voltage level 1028 might be a reference potential. At time t1, the tc signal node 432 and the data line 204 might optionally be discharged to a voltage level 1032. The voltage level 1032 is some voltage level lower than the voltage level 1030, and might correspond to the inhibit voltage Vinh plus a threshold voltage of a transistor to be used as a source follower for a subsequent programming phase of the programming operation, e.g., the threshold voltage of the transistor 447. For some embodiments, the threshold voltage of the source-follower transistor might be lower than or equal to 0V. To obtain voltage level 1031, for example, where the inhibit voltage Vinh is equal to the supply voltage Vcc, the tc signal node 432 and the data line 204 might be connected to the voltage node 448 through the transistor 447 while the control gate of the transistor 447 is also connected to the tc signal node 432 and data line 204, and the voltage node 448 receives the supply voltage Vcc. Doing this for each memory cell selected for programming might serve to mitigate any threshold voltage variation among the transistors 447, or other transistors to be used as source followers, for each page buffer circuit 400 during the subsequent programming phase of the programming operation. The tc signal node 432 might then be isolated from the data line 204.

At time t2, the tc signal node 432 might be boosted by applying a boost voltage level 1034 to the boost node 418. While the boost node 418 is depicted to initially be at the same voltage level as the tc signal node 432 at time t2, e.g., voltage level 1028, it could start at some other initial voltage level. After isolation of the tc signal node 432 from the data line 204, e.g., at time t2, a selected memory cell for the programming operation that is connected to the data line 204 might be selectively activated in response to a voltage level of a verify pulse 804 applied to its control gate while each remaining memory cell of its string of series-connected memory cells is activated, e.g., receiving a pass voltage. As a result, the data line 204 might be selectively discharged, e.g., to the common source 216.

For example, if the selected memory cell corresponding to the data line 204 remains deactivated in response to the verify pulse 804, the voltage level of the data line 204 might remain unchanged from its precharge voltage level, e.g., as depicted in trace $1020_0$. If the selected memory cell corresponding to the data line 204 is partially activated in response to the verify pulse 804, the voltage level of the data line 204 might decrease at a first rate, e.g., as depicted in trace $1020_1$. And if the selected memory cell corresponding to the data line 204 is fully activated in response to the verify pulse 804, the voltage level of the data line 204 might decrease at a second rate greater than the first rate, e.g., as depicted in trace $1020_2$. In general, the higher the $I_{string}$ current level for the string of series-connected memory cells containing the selected memory cell during the verify phase of the programming operation, the lower the resulting voltage level of its corresponding data line 204. At time t4, the data line 204 might be isolated from the common source 216. Note that the resulting voltage level of the data line 204 at time t3 might depend on the level of activation of its corresponding selected memory cell 208 as well as the length of time that the data line 204 is permitted to selectively discharge to the common source 216.

At time t4, the tc signal node 432 might be connected to its corresponding data line 204. If the corresponding data line 204 is represented by trace $1020_0$, the tc signal node 432 might decrease by a first amount, e.g., as depicted in trace $1022_0$, as the data line 204 might be at the voltage level 1032 that is lower than the boosted voltage level 1036 of the tc signal node 432 despite not being discharged. If the selected memory cell corresponding to the data line 204 is partially activated in response to the verify pulse 804, the voltage level of the tc signal node 432 might decrease by a second amount greater than the first amount, e.g., as depicted in trace $1022_1$. And if the selected memory cell corresponding to the data line 204 is fully activated in response to the verify pulse 804, the voltage level of the tc signal node 432 might decrease by a third amount greater than the second amount, e.g., as depicted in trace $1022_2$. In general, the higher the $I_{string}$ current level for the string of series-connected memory cells containing the selected memory cell during the verify phase of the programming operation, the lower the resulting voltage level of its corresponding tc signal node 432. At time t4, the tc signal node 432 might be isolated from the data line 204. Note that the resulting voltage level of the tc signal node 432 at time t4 might depend on the voltage level of the data line 204 and the length of time, e.g., a develop time, that the tc signal node 432 is connected to the data line 204 for discharge.

At time t5, the voltage level applied to the boost node 418 might be decreased to a first deboost voltage level 1042, lower than the boost voltage level 1034. As a result, the voltage level of the tc signal node 432 might be correspondingly decreased. At time t6, the page buffer circuit 400 might be strobed by transitioning the sen control signal node 422 to a logic high to activate the transistor 421 to selectively connect the sense amplifier latch 431 to the voltage node 452 through the transistor 451. Memory cells corresponding to tc signal nodes 432 that have a voltage level lower than the threshold voltage of the transistor 451 while the first deboost voltage level 1042 is applied to the boost node 418 (e.g., as evidenced by a value latched by the SA latch 431 during the first strobe) might be flagged to receive the enable voltage, e.g., to be fully enabled for programming, during the subsequent programming phase of the programming operation.

The first deboost voltage level 1042 might be selected to identify memory cells that are deemed to have a particular threshold voltage level below the target threshold voltage level of their intended data state, e.g., the data state to be verified during the verify phase of the programming operation. These memory cells might correspond to the range of threshold voltages $786_0$ in FIG. 7B. Lower voltage levels of the first deboost voltage level 1042 might be used to shift the range of threshold voltages $786_0$ in FIG. 7B to the right, e.g., to a higher range of threshold voltages, thus fully enabling greater numbers of memory cells. Higher voltage levels of the first deboost voltage level 1042 might be used to shift the range of threshold voltages $786_0$ in FIG. 7B to the left, e.g., to a lower range of threshold voltages, thus fully enabling lesser numbers of memory cells.

At time t7, the voltage level applied to the boost node 418 might be decreased to a second deboost voltage level 1044, lower than the first deboost voltage level 1042. As a result, the voltage level of the tc signal node 432 might be correspondingly decreased. At time t8, the page buffer circuit 400 might be strobed by transitioning the sen control signal node 422 to a logic high to activate the transistor 421 to selectively connect the sense amplifier latch 431 to the voltage node 452 through the transistor 451. Memory cells corresponding to tc signal nodes 432 that have voltage levels higher than (e.g., higher than or equal to) the threshold voltage of the transistor 451 while the second deboost voltage level 1044 is applied to the boost node 418 (e.g., as evidenced by a value latched by the SA latch 431 during the second strobe) might be flagged to receive the inhibit voltage, e.g., to be inhibited from programming, during the subsequent programming phase of the programming operation.

The second deboost voltage level 1044 might be selected to identify memory cells that are deemed to have a threshold voltage level higher than (e.g., higher than or equal to) the target threshold voltage level of their intended data state, e.g., the data state to be verified during the verify phase of the programming operation. These memory cells might correspond to the range of threshold voltages $786_{X+1}$ in FIG. 7B. Higher voltage levels of the second deboost voltage level 1044 might be used to shift the range of threshold voltages $786_{X+1}$ in FIG. 7B to the right, e.g., to a higher range of threshold voltages, thus inhibiting greater numbers of memory cells. Lower voltage levels of the second deboost voltage level 1044 might be used to shift the range of threshold voltages $786_{X+1}$ in FIG. 7B to the left, e.g., to a lower range of threshold voltages, thus inhibiting lesser numbers of memory cells.

It is noted that the number of memory cells selected for programming that indicate deactivation of the transistor 451 for each deboost voltage level might provide information for determining a VgVt value for the memory cells selected for programming. In particular, the number of memory cells that indicate deactivation at the first deboost voltage level 1042 would indicate a number of memory cells having a threshold voltage level lower than or equal to a first threshold voltage level, and the number of memory cells that indicate deactivation at the second deboost voltage level 1044 would indicate a number of memory cells having a threshold voltage level lower than or equal to a second threshold voltage level that is higher than the first threshold voltage level. Where a normal distribution of threshold voltages is presumed, these two data points could define characteristics of the normal distribution, e.g., the median of the normal distribution.

Identifying memory cells to be fully enabled for programming, or to be inhibited from programming, during a subsequent programming phase might further identify memory cells to be partially enabled for programming for the subsequent programming phase. For example, memory cells selected for programming to the data state to be verified by the verify phase of the programming operation that are not identified to be fully enabled for programming for the subsequent programming phase, and are not identified to be inhibited from programming for the subsequent programming phase, might represent those memory cells to be partially enabled for programming for the subsequent programming phase. The data lines corresponding to these memory cells might then be configured to receive a voltage level for the subsequent programming phase from a source-follower transistor in accordance with embodiments.

At time t9, the voltage level applied to the boost node 418 might be returned to its initial voltage level, e.g., the voltage level 1028. As a result, the voltage level of the tc signal node 432 might be correspondingly decreased. At time t10, the remaining voltage level of the tc signal node 432 might be indicative of the threshold voltage of its corresponding memory cell. For example, tc signal nodes 432 having voltage levels closer to the precharge voltage level, e.g., the voltage level 1032 (or 1030), might be expected to have threshold voltage levels closer to their respective target data states, while tc signal nodes 432 having voltage levels closer to the initial voltage level, e.g., the voltage level 1028, might be expected to have threshold voltage levels farther from their respective target data states. For those tc signal nodes 432 whose corresponding memory cells were not flagged to either receive the enable voltage or the inhibit voltage for a subsequent programming pulse might be flagged to receive a data line voltage level representative of, which might include equal to, the remaining voltage level of that tc signal node 432. These memory cells might correspond to the range of threshold voltages $786_1$-$786_X$ in FIG. 7B.

At time t10, the control gate of the transistor to be used as a source follower might be connected to the tc signal node 432, thus applying a voltage level at the control gate representative of the remaining voltage level of the tc signal node 432. Using the transistor 447 as an example, the transistors 449, 435, and 419 might be activated. While transistors 449, 435, and 419 are activated, the transistor 433 might be deactivated in response to the en_sspc2 control signal node 434. In this manner, the tc signal node 432 might be isolated from the voltage node 448. This might connect the voltage level of the tc signal node 432, or a voltage level representative of the voltage level of the tc signal node 432, to the control gate of the transistor 447. The transistor 449 and/or the transistor 435 might subsequently be deactivated, leaving the control gate of the transistor 447 electrically floating with a voltage level representative to the voltage level of the tc signal node 432.

For a subsequent programming pulse, a voltage level higher than the enable voltage level might be applied to the voltage node 448 while the transistor 447 is connected to the data line 204 and its control gate remains electrically floating at a voltage level representative of the remaining voltage level of the tc signal node 432 following the verify phase of the programming operation. For example, the transistor 449 and/or the transistor 435 might remain deactivated, and the transistors 433, 419, 411, 405, and 401 might be activated to connect the transistor 447 to the data line 204. In this manner, the data line 204 might receive a voltage level that is lower than or equal to the voltage level applied to the voltage node 448, which might further be higher than (e.g., higher than or equal to) the enable voltage. For some embodiments, the voltage level applied to the voltage node 448 might be equal to the inhibit voltage Vinh. For further embodiments, the voltage level applied to the voltage node 448 might be higher than the inhibit voltage Vinh.

It is recognized that the length of time the data line 204 is permitted to selectively discharge through the memory cell from time t2-t3 of FIG. 10, and the length of time the tc signal node 432 is permitted to discharge to the data line 204 from time t3-t4 of FIG. 10, will each affect the extent of discharge of the tc signal node 432 at time t4 of FIG. 10. Determining suitable lengths of time, as well as suitable boost and deboost voltage levels, to identify groups of memory cells that should be fully enabled for programming and groups of memory cells that should be inhibited from programming, might, for example, be determined experimentally, empirically or through simulation based on known characteristics (e.g., intrinsic properties) of the participating circuit elements.

Figure 11A:
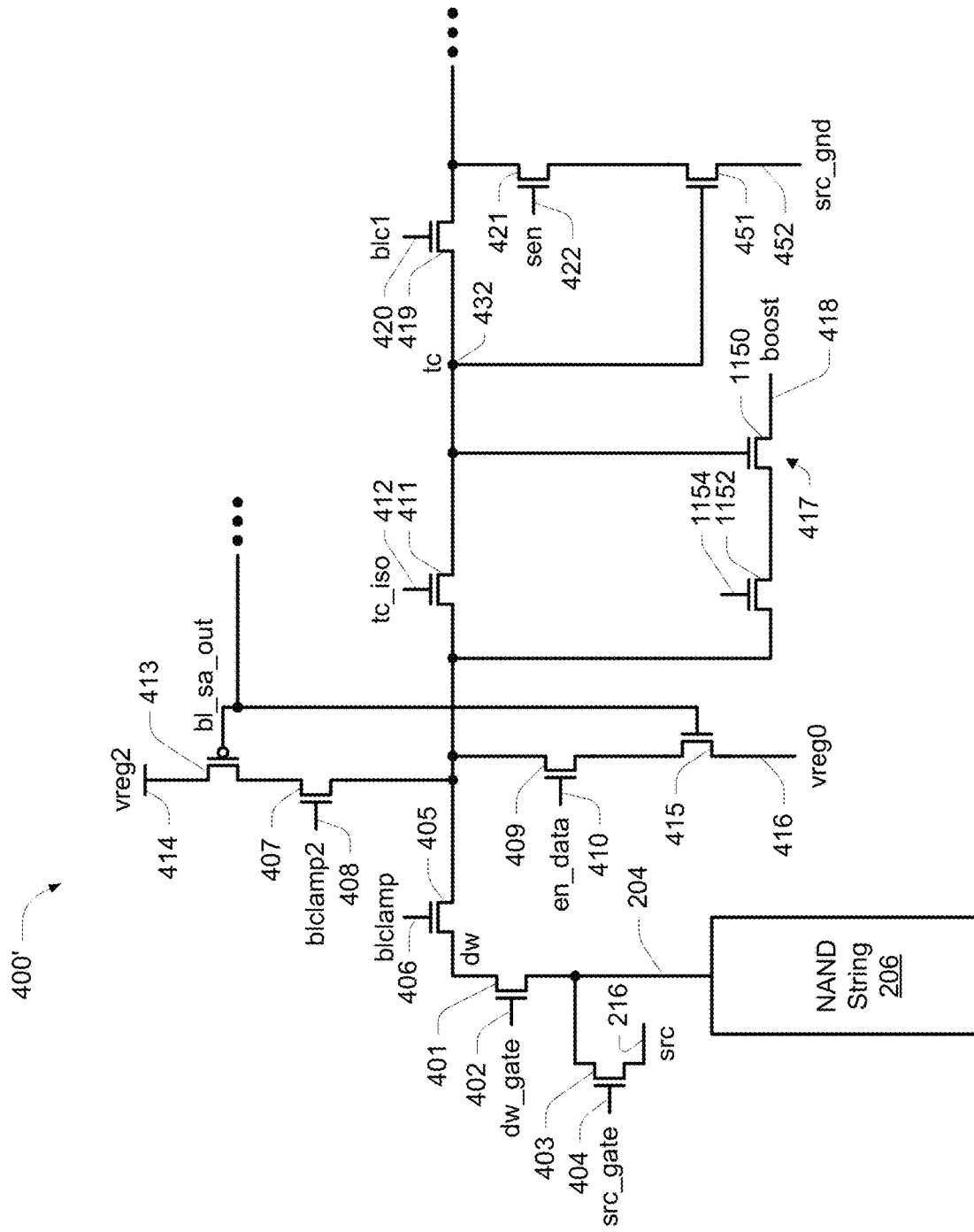
FIGS. 11A-11B depict alternate examples of suitable source-follower transistors for use with embodiments.
Figure 11B:
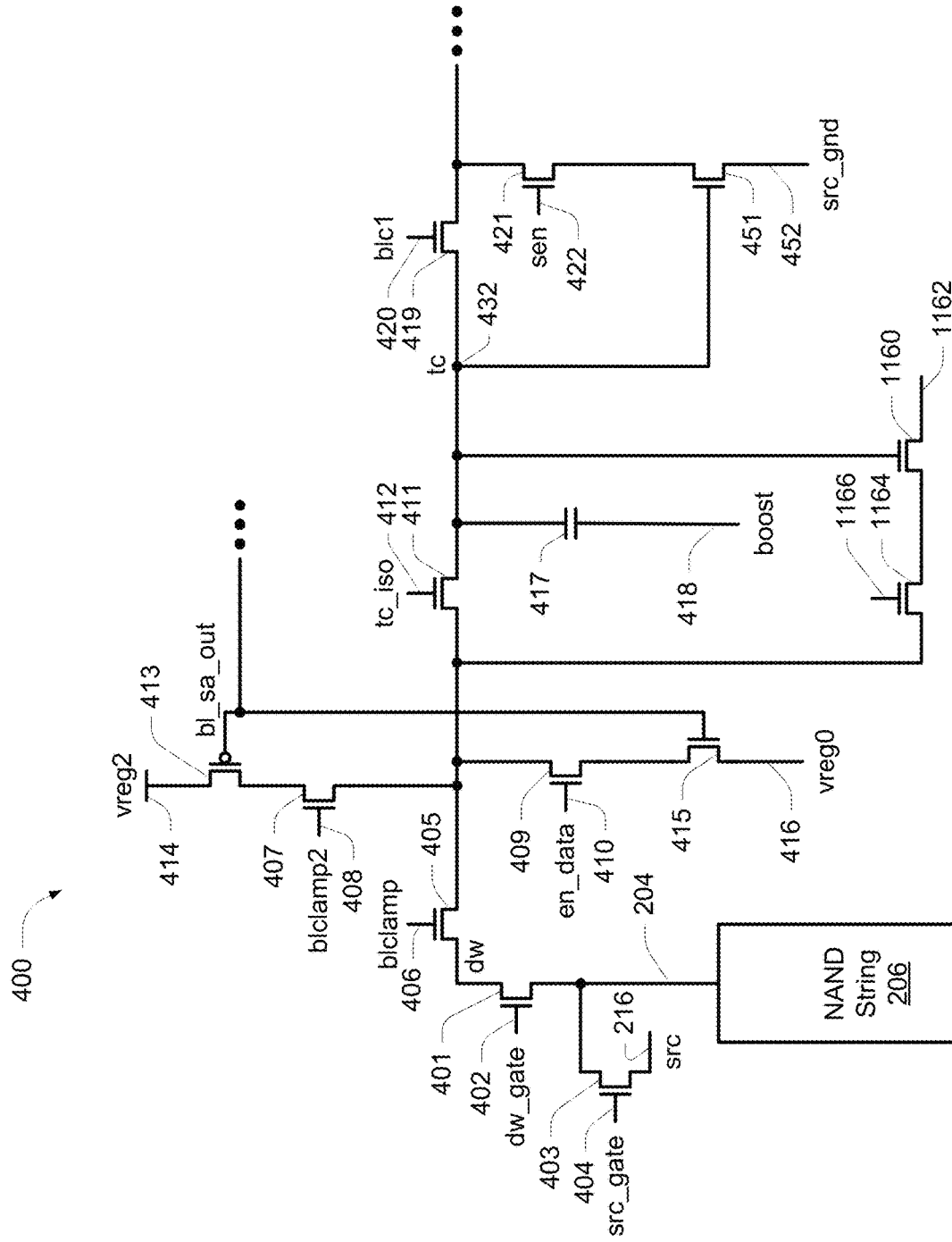

Although the transistor 447 of the page buffer circuit 400 was utilized as the source-follower transistor in the foregoing example, a source-follower transistor to be used for various embodiments could be another transistor that has a control gate connected or selectively connected to a node of a page buffer circuit whose voltage level is indicative of a data state of a memory cell following a verify phase of a programming operation, a source/drain selectively connected to a corresponding data line of the memory cell, and another source/drain configured to receive a voltage level for driving the corresponding data line during a subsequent programming phase of the programming operation. Note that such guidance can be applied to page buffer circuits of designs other than that depicted in FIGS. 4A-4B. FIGS. 11A and 11B depict alternate examples of suitable source-follower transistors for use with embodiments.

Semiconductor capacitors might be formed as a transistor that is not configured for current flow, such as by deadheading one or both source/drain regions of the transistor. FIG. 11A depicts how the sense capacitor 417 might be formed as a transistor that could be further utilized as a source-follower transistor. In FIG. 11A, the sense capacitor 417 might be a transistor 1150 having its control gate connected to the tc signal node 432, having a first source/drain connected to the voltage node 418, and having a second source/drain connected to a first source/drain of transistor 1152. The control gate of the transistor 1152 might be connected to a control signal node 1154, which might be in communication with the control logic 116. Although the second source/drain of transistor 1152 is depicted to be connected to the first source/drain of the transistor 411, it could be connected anywhere between a transistor isolating the tc signal node 432 from the data line 204 and the data line 204 itself. In the example of FIG. 11A, the second source/drain of transistor 1152 might thus alternatively be connected between the transistor 405 and the transistor 401, or connected directly to the data line 204.

When utilizing the transistor 1150 (e.g., sense capacitor 417) for boosting and deboosting the tc signal node 432 during the verify phase, the control signal node 1154 might receive a control signal configured to deactivate the transistor 1152. The boost-deboost voltage levels applied to the voltage node 418 might be as described with reference to FIGS. 4A and 10. In preparing the transistor 1150 for driving the data line 204 during a programming phase, the voltage level of the tc signal node 432 remaining after the verify phase might be retained on the control gate of the transistor 1150 by deactivating the transistors 411 and 419 in the example of FIG. 11A. The control signal node 1154 might then receive a control signal configured to activate the transistor 1152. A voltage level to be applied to the voltage node 418 might then be as described with reference to the voltage level applied to voltage node 448 for use of the transistor 447 as a source-follower.

While previous examples of a source-follower transistor repurposed existing transistors of a page buffer circuit, embodiments could alternatively add a transistor to any page buffer circuit. For example, in FIG. 11B, a transistor 1160 might be added to an existing page buffer circuit, e.g., the page buffer circuit 400. The control gate of transistor 1160 might be connected to the tc signal node 432 or other node of a page buffer circuit that is indicative of a data state of a memory cell following a verify phase of a programming operation. A first source/drain of the transistor 1160 might be connected to a voltage node 1162. A second source/drain of the transistor 1160 might be connected to a first source/drain of the transistor 1164. Although the control gate of the transistor 1160 is depicted to be connected directly to the tc signal node 432, it alternatively could be selectively connected to the tc signal node 432 anywhere in the page buffer circuit, provided that the control gate of the transistor 1160 can receive a voltage level representative of the voltage level of a node of the page buffer circuit that is indicative of a data state of a memory cell following a verify phase of a programming operation, e.g., the tc signal node 432, and the can be made to retain that voltage level, e.g., by subsequently electrically floating the control gate.

The control gate of the transistor 1164 might be connected to a control signal node 1166, which might be in communication with the control logic 116. Although the second source/drain of transistor 1164 is depicted to be connected to the first source/drain of the transistor 411, it could be connected anywhere between a transistor isolating the tc signal node 432 from the data line 204 and the data line 204 itself. In the example of FIG. 11B, the second source/drain of transistor 1164 might thus alternatively be connected between the transistor 405 and the transistor 401, or connected directly to the data line 204.

In preparing the transistor 1160 for driving the data line 204 during a programming phase, the voltage level of the tc signal node 432 remaining after the verify phase might be retained on the control gate of the transistor 1160 by deactivating the transistors 411 and 419 in the example of FIG. 11B. The control signal node 1166 might then receive a control signal configured to activate the transistor 1164. A voltage level to be applied to the voltage node 1162 might then be as described with reference to the voltage level applied to voltage node 448 for use of the transistor 447 as a source-follower. When not using the transistor 1160 as a source-follower for various embodiments, the control signal node 1166 might receive a control signal configured to deactivate the transistor 1164, and the voltage node 1162 might receive a reference potential, for example.

Figure 12A:
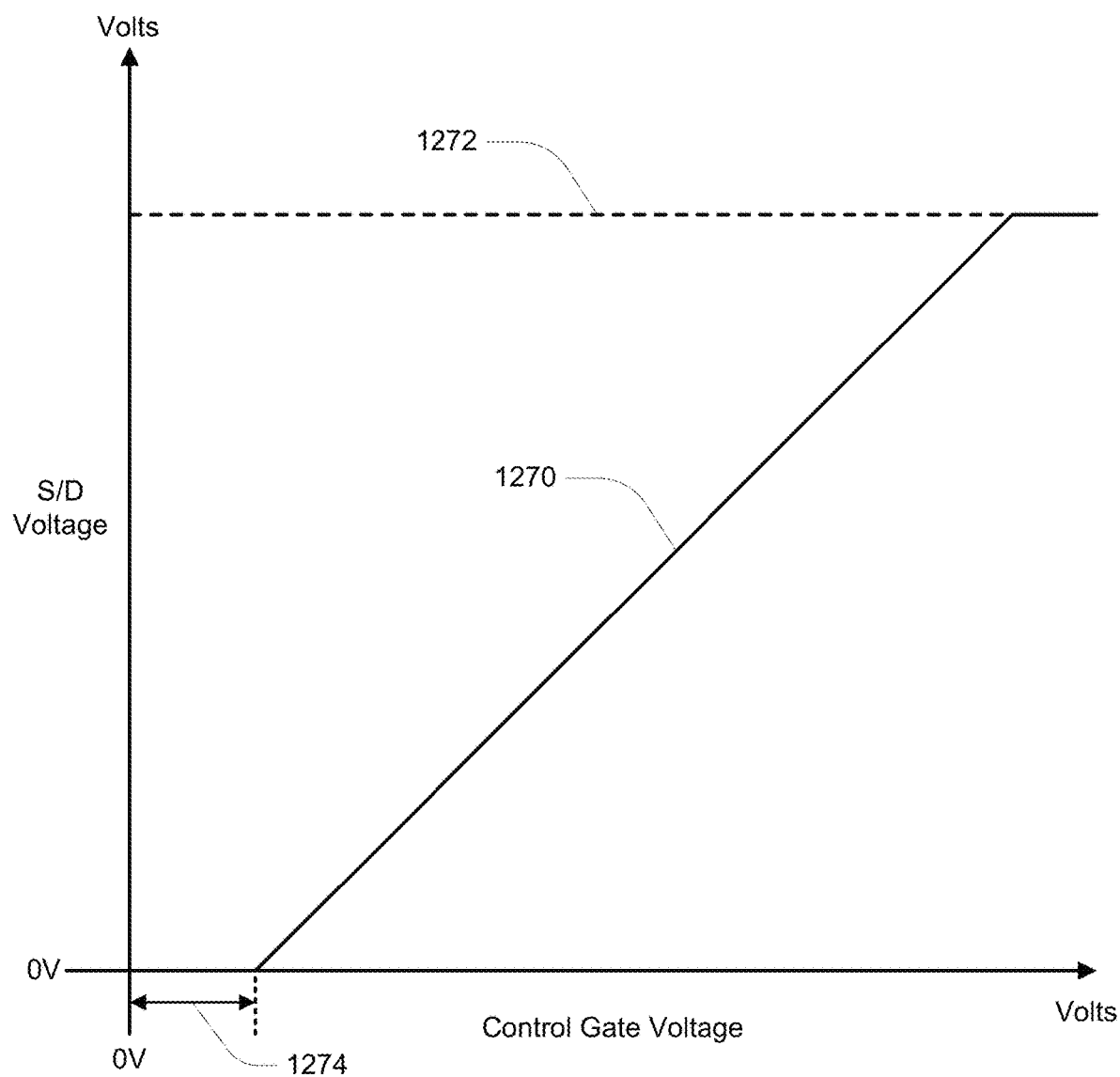
FIGS. 12A-12B depict conceptual relationships between control gate voltages of a source-follower transistor, and voltage levels of a source of the transistor for a particular voltage level applied to its drain.
Figure 12B:
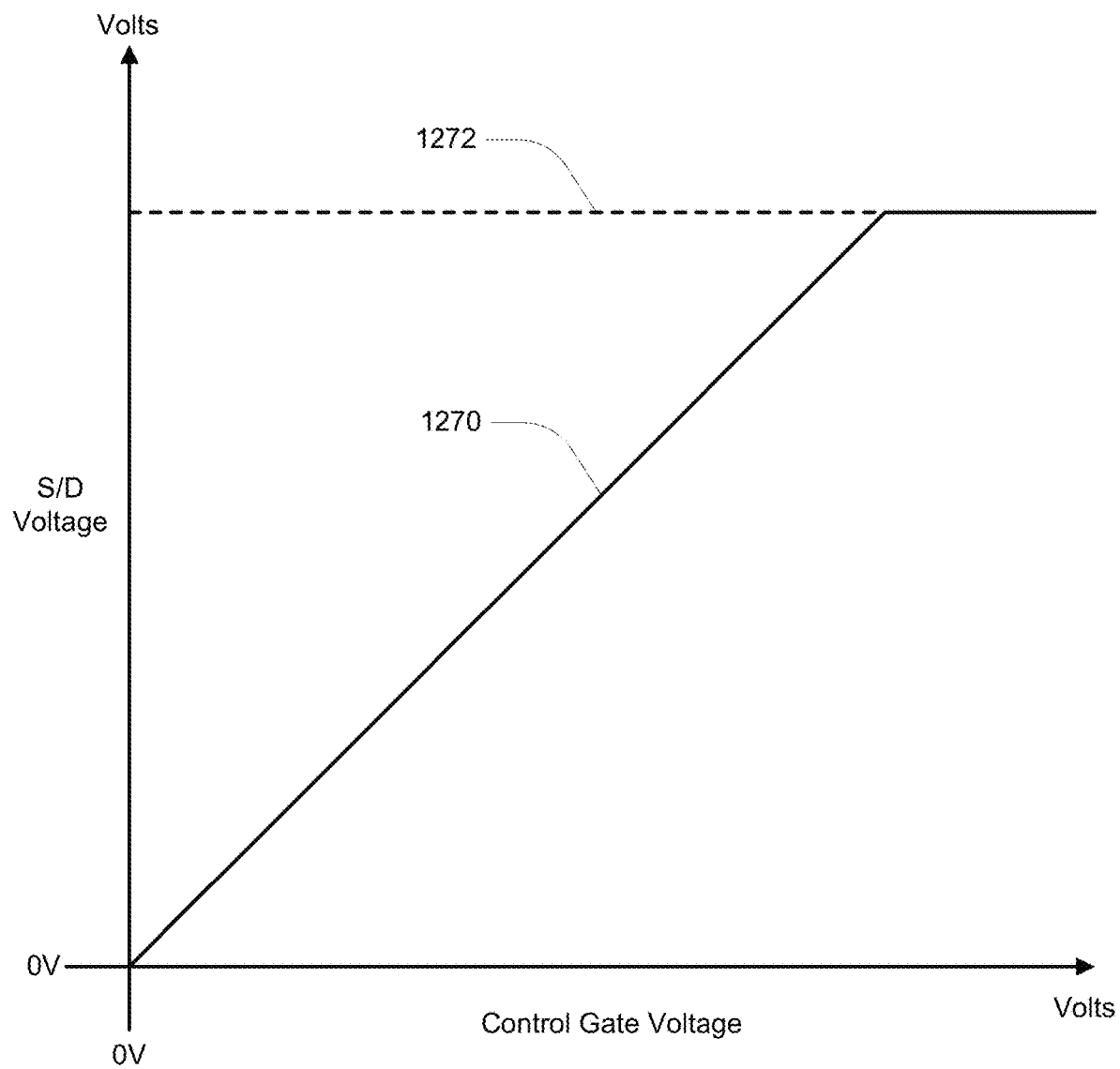

FIGS. 12A-12B depict conceptual relationships between control gate voltages of a source-follower transistor, and a voltage level (e.g., output voltage level) of a source of the transistor for a particular voltage level applied to its drain. FIG. 12A contemplates a transistor having a positive threshold voltage, while FIG. 12B contemplates a transistor having a threshold voltage of 0V or lower. Traces 1270 might represent the source voltage level of a transistor, while traces 1272 might represent the drain voltage level of that transistor.

In FIG. 12A, the voltage level of the drain of the transistor, e.g., trace 1272, might be equal to the inhibit voltage Vinh, although higher or lower voltage levels could be used. In this manner, the voltage level of the source of the transistor, e.g., trace 1270, might be equal to the voltage level of the control gate of the transistor, minus the threshold voltage of the transistor, for voltage levels of the control gate equal to or higher than the threshold voltage 1274 of the transistor and equal to or lower than the voltage level of the drain. As such, the voltage level of the source might remain at 0V until the voltage level of the control gate is equal to the threshold voltage, and might generally increase at a slope of 1, e.g., the voltage level of the source might be expected to increase by X volts for every X-volt increase in the voltage level of the control gate. If the voltage level of the drain of the transistor is equal to the inhibit voltage Vinh plus the threshold voltage 1274 of the transistor, the voltage level of the source might be expected to have a value between 0V and the inhibit voltage Vinh, depending upon a voltage level of the control gate of the transistor.

It is known that the threshold voltage of a transistor can be modified through appropriate channel doping. As such, a transistor to be used as a source-follower could be made to have a threshold voltage at or near 0V. For embodiments using a source-follower transistor having a threshold voltage of 0V, as depicted in FIG. 12B, the voltage level of the source, e.g., trace 1270, might be expected to generally be equal to the voltage level of the control gate for voltage levels between 0V and the voltage level of the drain, e.g., trace 1272. If the voltage level of the drain of the transistor is equal to the inhibit voltage Vinh, the voltage level of the source might be expected to have a value between 0V and the inhibit voltage Vinh, depending upon a voltage level of the control gate of the transistor.

Figure 13:
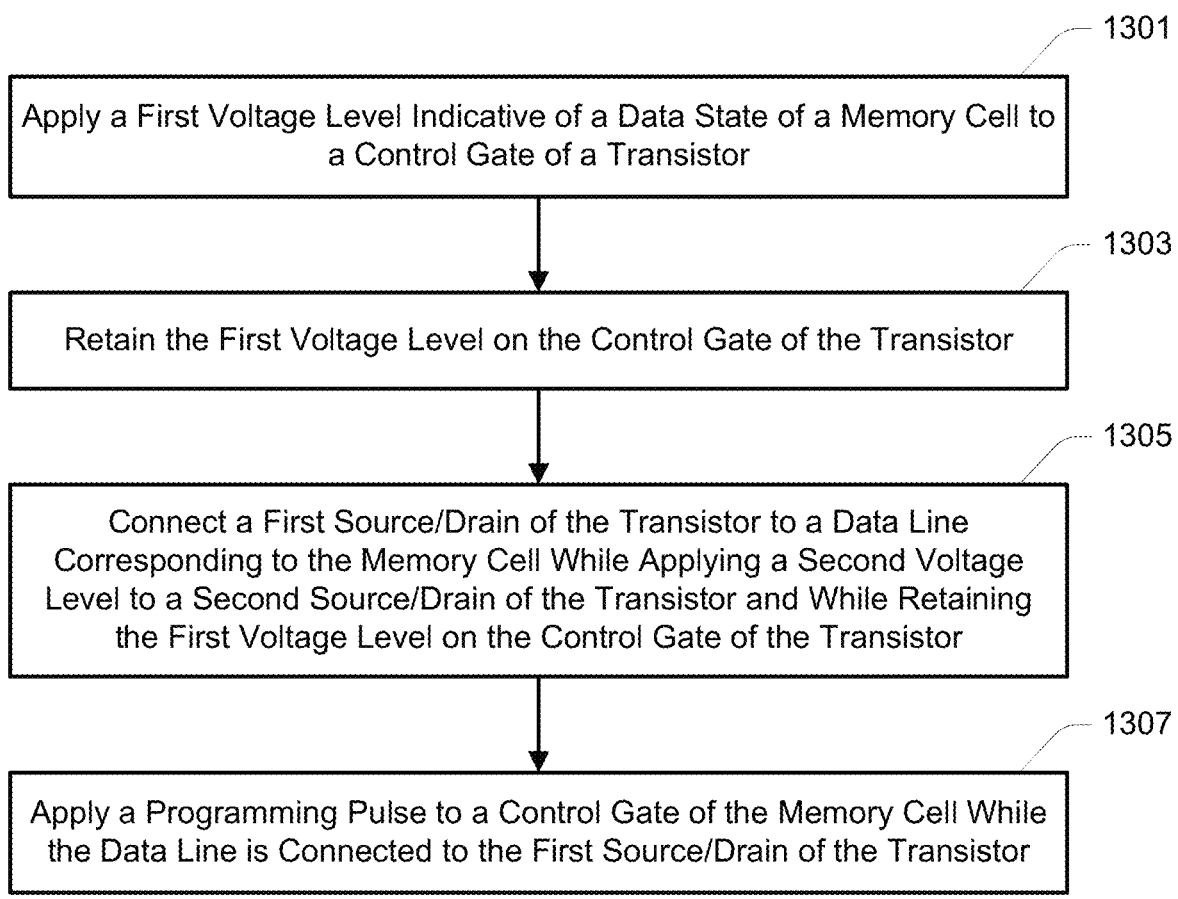
FIG. 13 is a flowchart of a method of operating a memory in accordance with an embodiment.

FIG. 13 is a flowchart of a method of operating a memory in accordance with an embodiment. The method might represent actions associated with a programming operation, e.g., portions of a verify phase and programming phase of the programming operation, performed by the memory. The method might be in the form of computer-readable instructions, e.g., stored to the instruction registers 128. Such computer-readable instructions might be executed by a controller, e.g., the control logic 116, to cause the relevant components of the memory to perform the method.

At 1301, a first voltage level indicative of a data state of a memory cell might be applied to a control gate of a transistor. The transistor might represent the transistor 447 of FIG. 4A, the transistor 1150 of FIG. 11A, or the transistor 1160 of FIG. 11B, for example. The memory cell might represent a memory cell 208 selectively connected to a page buffer circuit. The first voltage level indicative of the data state of the memory cell might represent the voltage level of a node of the page buffer circuit. For example, the node of the page buffer circuit might be the tc signal node 432 of the page buffer circuit 400, or the voltage level of a different node of the page buffer circuit 400 while connected to the tc signal node 432, such as the control gate of the transistor 447. The voltage level of the node of the page buffer circuit might indicate how near the memory cell is to a desired data state. Higher voltage levels might indicate that the memory cell is closer to its desired data state, while lower voltage levels might indicate that the memory cell is farther from its desired data state. At 1303, the first voltage level might be retained on the control gate of the transistor. For example, the control gate of the transistor might be electrically floated, e.g., isolating it from any current sink or current source. For the transistor 447 of FIG. 4A, the transistor 449 might be deactivated to electrically float the control gate of the transistor 447. For the transistor 1150 of FIG. 11A, the transistors 411 and 419 might be deactivated to electrically float the control gate of the transistor 1150. For the transistor 1160 of FIG. 11B, the transistors 411 and 419 might be deactivated to electrically float the control gate of the transistor 1160.

At 1305, a first source/drain of the transistor might be connected to a data line corresponding to the memory cell while applying a second voltage level to a second source/drain of the transistor and while retaining the first voltage level on the control gate of the transistor. Using the example of the transistor 447 corresponding to the transistor in the method, the transistors 433, 419, 411, 405, and 401 might be activated to connect a source/drain of the transistor 447 to the data line 204. The second voltage level might correspond to (e.g., be equal to) an inhibit voltage level of the programming operation, e.g., a voltage level configured to inhibit an increase in threshold voltage level of a memory cell receiving a programming voltage level on its control gate while its corresponding data line receives the inhibit voltage level. For other embodiments, the second voltage level might be higher than the inhibit voltage level.

In response to connecting the data line to the first source/drain of the transistor while applying the second voltage level to the second source/drain of the transistor and while retaining the first voltage level on the control gate of the transistor, a voltage level applied to the data line might be expected to be between the inhibit voltage level of the programming operation and an enable voltage level of the programming operation, e.g., a voltage level configured to cause an increase in threshold voltage level of a memory cell receiving the programming voltage level on its control gate while its corresponding data line receives the enable voltage level.

At 1307, a programming pulse might be applied to a control gate of the memory cell while the data line is connected to the first source/drain of the transistor. The programming pulse might have the programming voltage level for a programming phase of the programming operation, subsequent to (e.g., immediately subsequent to) the verify phase of the programming operation producing the first voltage level at 1301.

Figure 14:
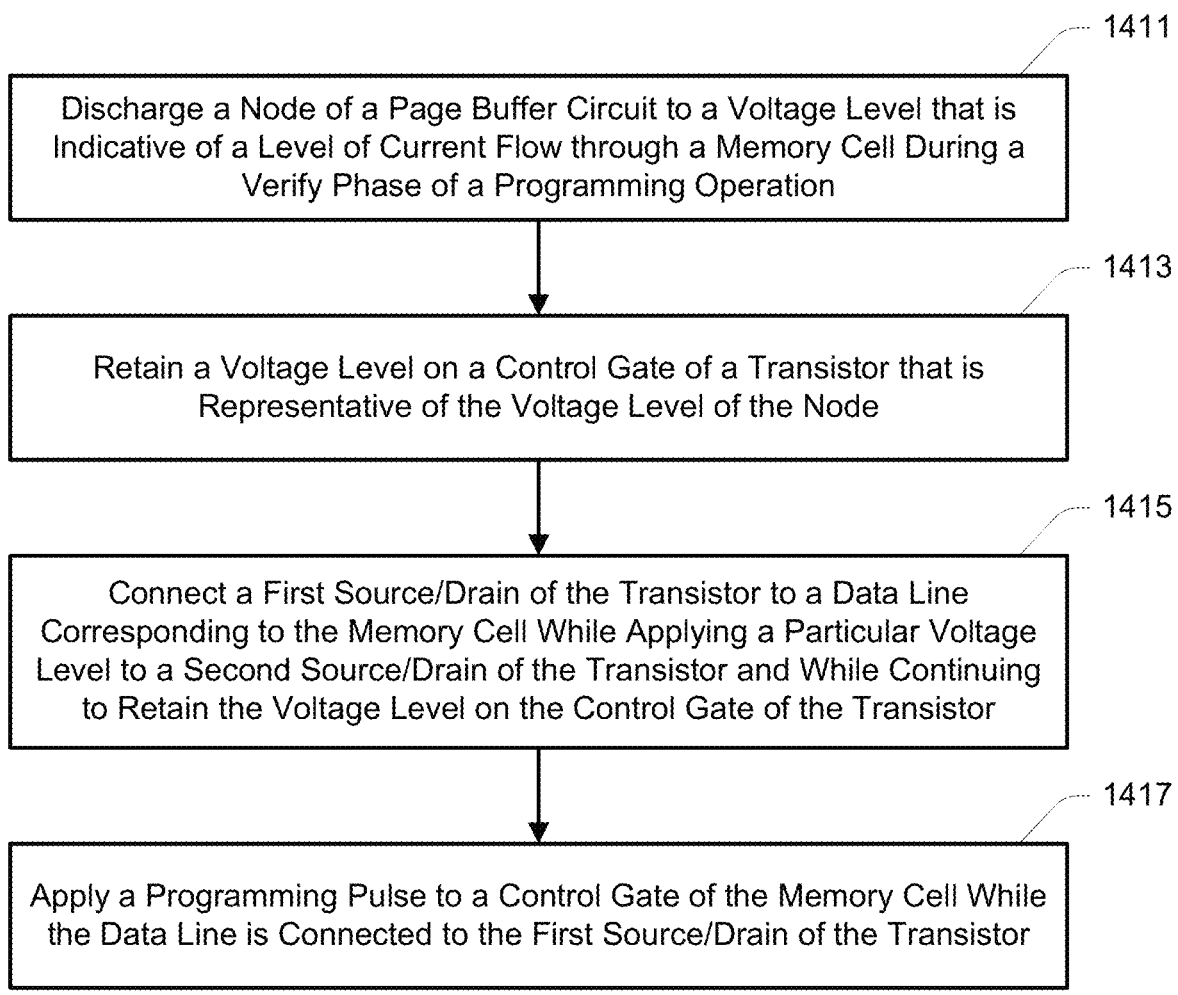
FIG. 14 is a flowchart of a method of operating a memory in accordance with another embodiment.

FIG. 14 is a flowchart of a method of operating a memory in accordance with an embodiment. The method might represent actions associated with a programming operation, e.g., portions of a verify phase and programming phase of the programming operation, performed by the memory. The method might be in the form of computer-readable instructions, e.g., stored to the instruction registers 128. Such computer-readable instructions might be executed by a controller, e.g., the control logic 116, to cause the relevant components of the memory to perform the method.

At 1411, a node of a page buffer circuit might be discharged to a voltage level that is indicative of a level of current flow through a memory cell during a verify phase of a programming operation. For example, a tc signal node 432 might be discharged as described with reference to times t3-t4 in FIG. 10.

At 1413, a voltage level might be retained on a control gate of a transistor that is representative of the voltage level of the node. For example, the control gate of the transistor might be connected to the node, then the control gate of the transistor might be electrically floated. Alternatively, for a transistor having its control gate directly connected to the node, the control gate of the transistor might be electrically floated without having to actively connect the control gate to the node. The transistor might correspond to the transistor 447 of FIG. 4A, the transistor 1150 of FIG. 11A, or the transistor 1160 of FIG. 11B, for example.

The control gate of the transistor 447 might be connected to the tc signal node 432 by activating the transistors 439, 435, and 419, thus receiving its voltage level representative of the voltage level of the node. That voltage level might then be retained by deactivating the transistor 449. The control gates of the transistors 1150 and 1160 might be directly connected to the tc signal node 432, such that their voltage level representative of the voltage level of the node might be the voltage level of the tc signal node 432. Their voltage levels might each be retained by deactivating the transistors 411 and 419.

At 1415, a first source/drain of the transistor might be connected to a data line corresponding to the memory cell while applying a particular voltage level to a second source/drain of the transistor and while continuing to electrically float the control gate of the transistor. The particular voltage level might correspond to (e.g., be equal to) an inhibit voltage level of the programming operation. For other embodiments, the particular voltage level might be higher than the inhibit voltage level. At 1417, a programming pulse might be applied to a control gate of the memory cell while the data line is connected to the first source/drain of the transistor.

Figure 15:
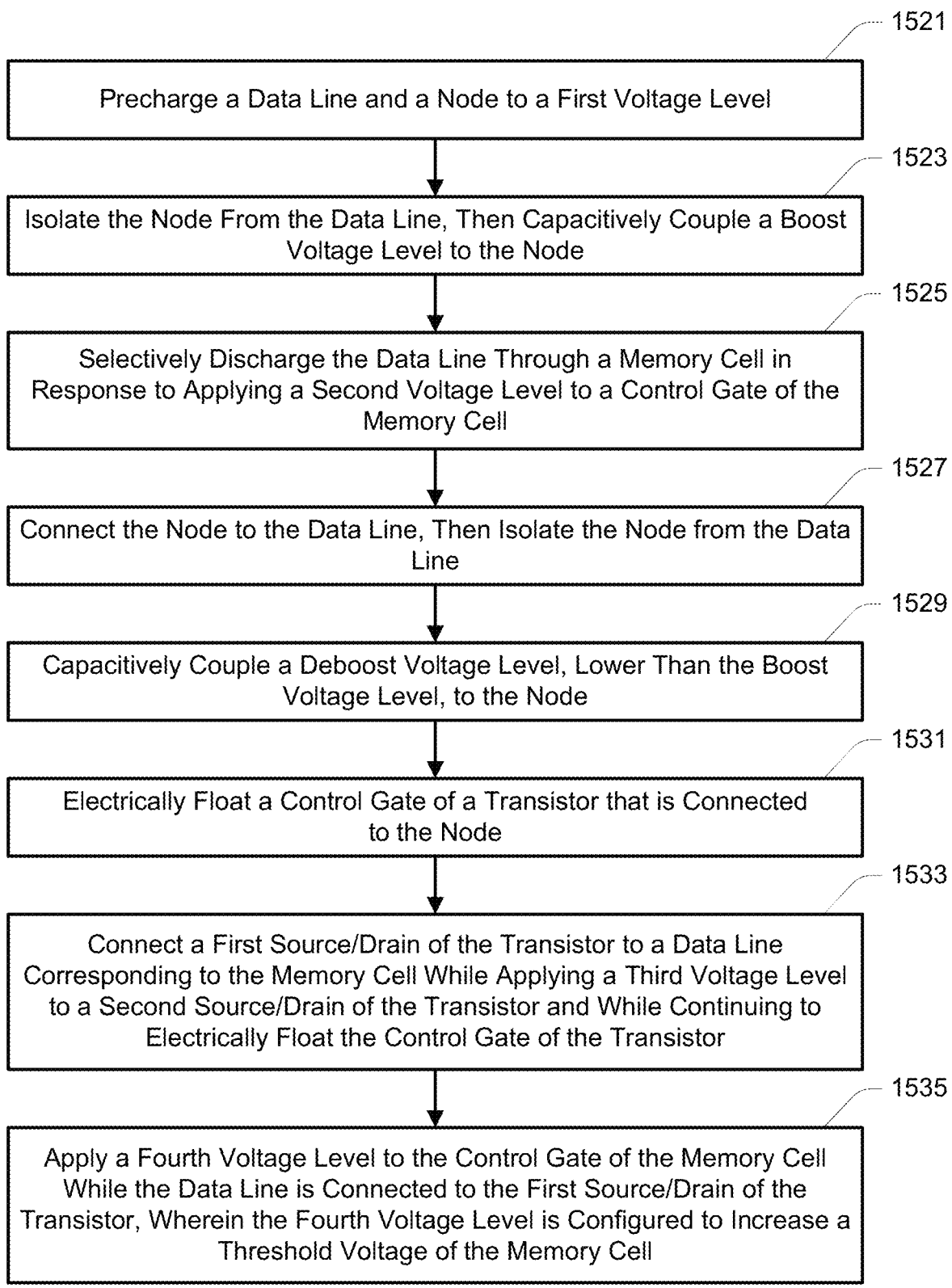
FIG. 15 is a flowchart of a method of operating a memory in accordance with a further embodiment.

FIG. 15 is a flowchart of a method of operating a memory in accordance with an embodiment. The method might represent actions associated with a programming operation, e.g., portions of a verify phase and programming phase of the programming operation, performed by the memory. The method might be in the form of computer-readable instructions, e.g., stored to the instruction registers 128. Such computer-readable instructions might be executed by a controller, e.g., the control logic 116, to cause the relevant components of the memory to perform the method.

At 1521, a data line and a node might be precharged to a first voltage level. This might correspond to times t0-t2 of FIG. 10. The first voltage level might correspond to the voltage level 1032 of FIG. 10 where the optional discharge of the data line and node is utilized, or the voltage level 1030 where it is not.

At 1523, the node might be isolated from the data line, then a boost voltage level might be capacitively coupled to the node. This might correspond to times t2-t3 of FIG. 10. At 1525, the data line might be selectively discharged through a memory cell in response to applying a second voltage level to a control gate of the memory cell. This might further correspond to times t2-t3 of FIG. 10. The second voltage level might correspond to a voltage level of one of the verify pulses 804 of FIG. 8.

At 1527, the node might be connected to the data line, then the node might be isolated from the data line. This might correspond to times t3-t4 of FIG. 10. At 1529, a deboost voltage level, lower than the boost voltage level, might be capacitively coupled to the node. This might correspond to times t9-t10 of FIG. 10. Note that additional deboost voltage levels might be previously capacitively coupled to the node, e.g., to identify memory cells to be either fully enabled for programming, or inhibited from programming, during a subsequent programming phase of the programming operation.

At 1531, a control gate of a transistor that is connected to the node might be electrically floated. The transistor might correspond to the transistor 447 of FIG. 4A, the transistor 1150 of FIG. 11A, or the transistor 1160 of FIG. 11B, for example. The control gate of the transistor 447 might be connected to the tc signal node 432 by activating the transistors 439, 435, and 419, and might then be electrically floated by deactivating the transistor 449. The control gates of the transistors 1150 and 1160 might be directly connected to the tc signal node 432, and might be electrically floated by deactivating the transistors 411 and 419.

At 1533, a first source/drain of the transistor might be connected to a data line corresponding to the memory cell while applying a third voltage level to a second source/drain of the transistor and while continuing to electrically float the control gate of the transistor. The third voltage level might correspond to (e.g., be equal to) an inhibit voltage level of the programming operation. For other embodiments, the third voltage level might be higher than the inhibit voltage level.

At 1535, a fourth voltage level might be applied to the control gate of the memory cell while the data line is connected to the first source/drain of the transistor, wherein the fourth voltage level is configured to increase a threshold voltage of the memory cell, e.g., while the data line is receiving a voltage level from the first source/drain of the transistor. The fourth voltage level might be a voltage level of a programming pulse determined in response to a value of VgVt for a group of memory cells, e.g., a group of memory cells having a same desired data state for the programming operation, resulting from a prior (e.g., immediately prior) programming pulse, and a desired threshold voltage for that desired data state, e.g., the data state being verified by the prior verify phase of the programming operation.

Figure 16A:
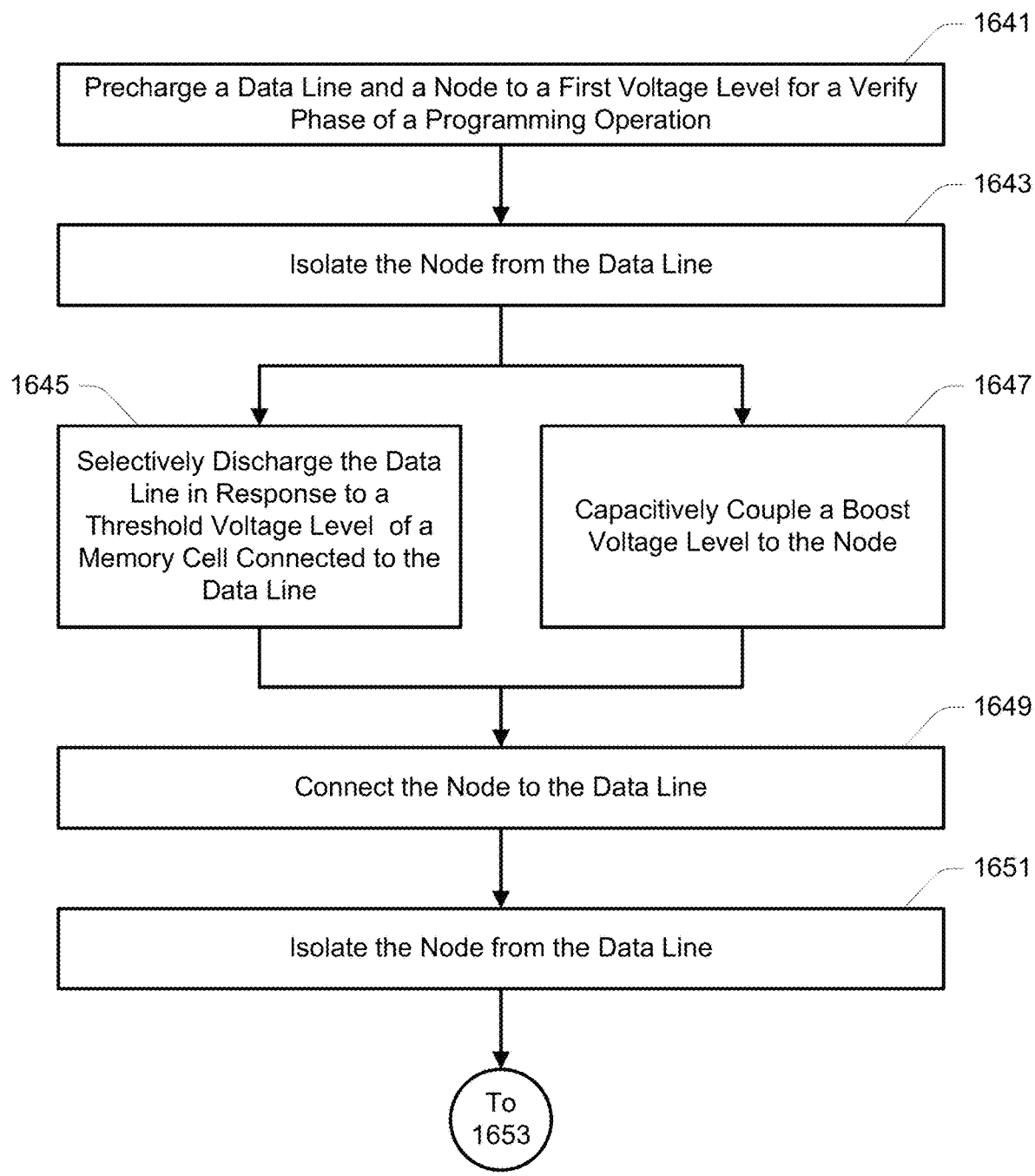
FIGS. 16A-16B are a flowchart of a method of operating a memory in accordance with a still further embodiment.
Figure 16B:
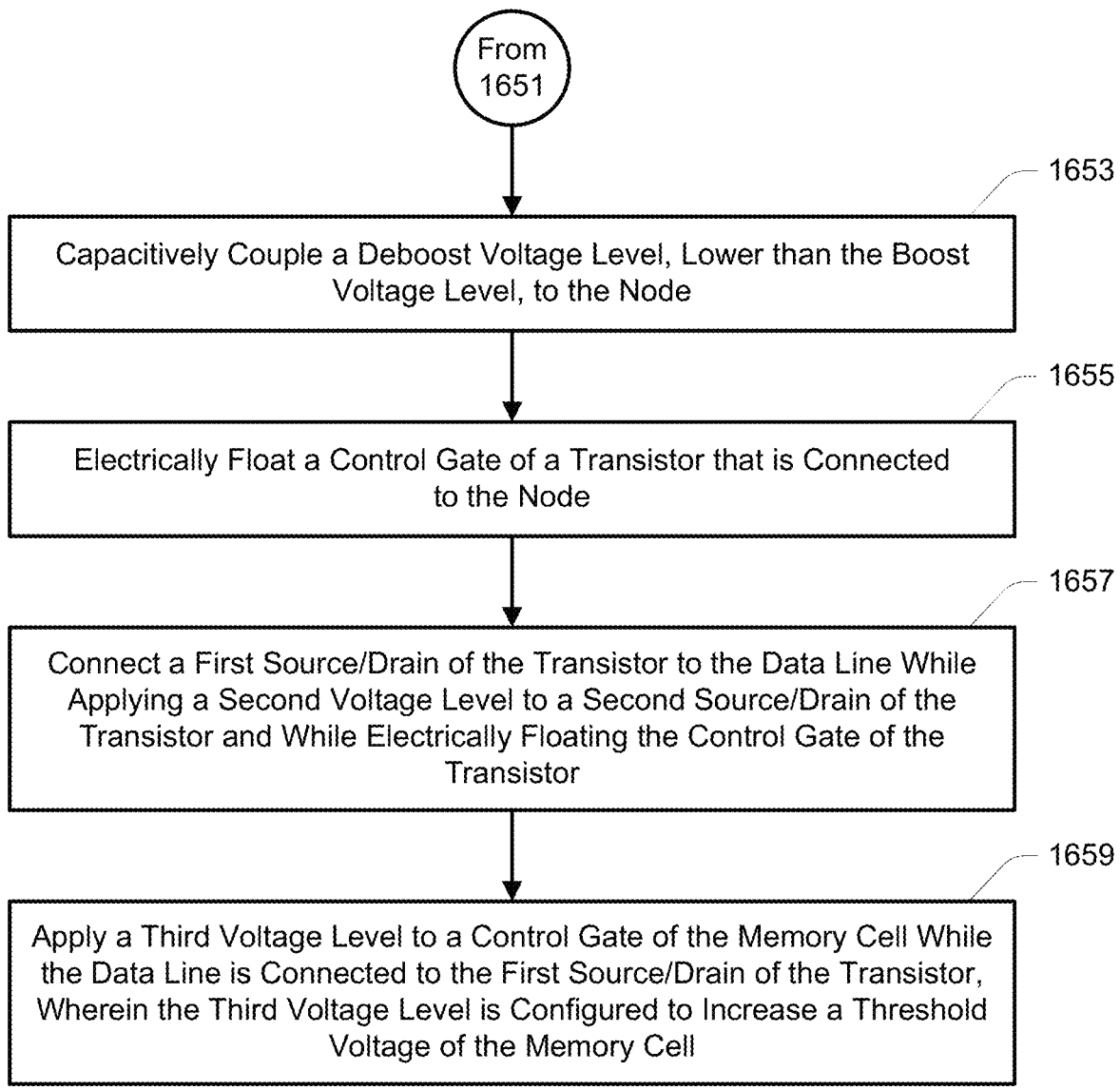

FIGS. 16A-16B are a flowchart of a method of operating a memory in accordance with an embodiment. The method might represent actions associated with a programming operation, e.g., portions of a verify phase and programming phase of the programming operation, performed by the memory. The method might be in the form of computer-readable instructions, e.g., stored to the instruction registers 128. Such computer-readable instructions might be executed by a controller, e.g., the control logic 116, to cause the relevant components of the memory to perform the method.

At 1641, a data line and a node (e.g., of a page buffer circuit) might be precharged to a first voltage level for a verify phase of a programming operation. This might correspond to times t0-t2 of FIG. 10. The first voltage level might correspond to the voltage level 1032 of FIG. 10 where the optional discharge of the data line and node is utilized, or the voltage level 1030 where it is not. The verify phase might seek to verify a particular data state, which might correspond to any one of the data states L1-L7 for a TLC memory, or any one of the data states L1-L15 for a QLC memory, for example.

At 1643, the node might be isolated from the data line. This might correspond to time t2 of FIG. 10. At 1645, the data line might be selectively discharged in response to a threshold voltage level of a memory cell connected to the data line. This might correspond to times t2-t3 of FIG. 10. At 1647, a boost voltage level might be capacitively coupled to the node. This might further correspond to times t2-t3 of FIG. 10.

At 1649, the node might be connected to the data line. This might correspond to time t3 of FIG. 10. At 1651, the node might be isolated from the data line. This might correspond to time t4 of FIG. 10.

At 1653, a deboost voltage level, lower than the boost voltage level, might be capacitively coupled to the node.

This might correspond to times t9-t10 of FIG. 10. Note that additional deboost voltage levels might be previously capacitively coupled to the node.

At 1655, a control gate of a transistor that is connected to the node might be electrically floated, e.g., while the node is capacitively coupled to the deboost voltage level. The transistor might correspond to the transistor 447 of FIG. 4A, the transistor 1150 of FIG. 11A, or the transistor 1160 of FIG. 11B, for example. The control gate of the transistor 447 might be connected to the tc signal node 432 by activating the transistors 439, 435, and 419, and might then be electrically floated by deactivating the transistor 449. The control gates of the transistors 1150 and 1160 might be directly connected to the tc signal node 432, and might be electrically floated by deactivating the transistors 411 and 419.

At 1657, a first source/drain of the transistor might be connected to a data line corresponding to the memory cell while applying a second voltage level to a second source/drain of the transistor and while continuing to electrically float the control gate of the transistor. The second voltage level might correspond to (e.g., be equal to) an inhibit voltage level of the programming operation. For other embodiments, the second voltage level might be higher than the inhibit voltage level.

At 1659, a third voltage level might be applied to the control gate of the memory cell while the data line is connected to the first source/drain of the transistor, wherein the third voltage level is configured to increase a threshold voltage of the memory cell. The third voltage level might be a voltage level of a programming pulse determined in response to a value of VgVt for a group of memory cells, e.g., a group of memory cells having a same desired data state for the programming operation, resulting from a prior (e.g., immediately prior) programming pulse, and a desired threshold voltage for that desired data state.

Figure 17A:
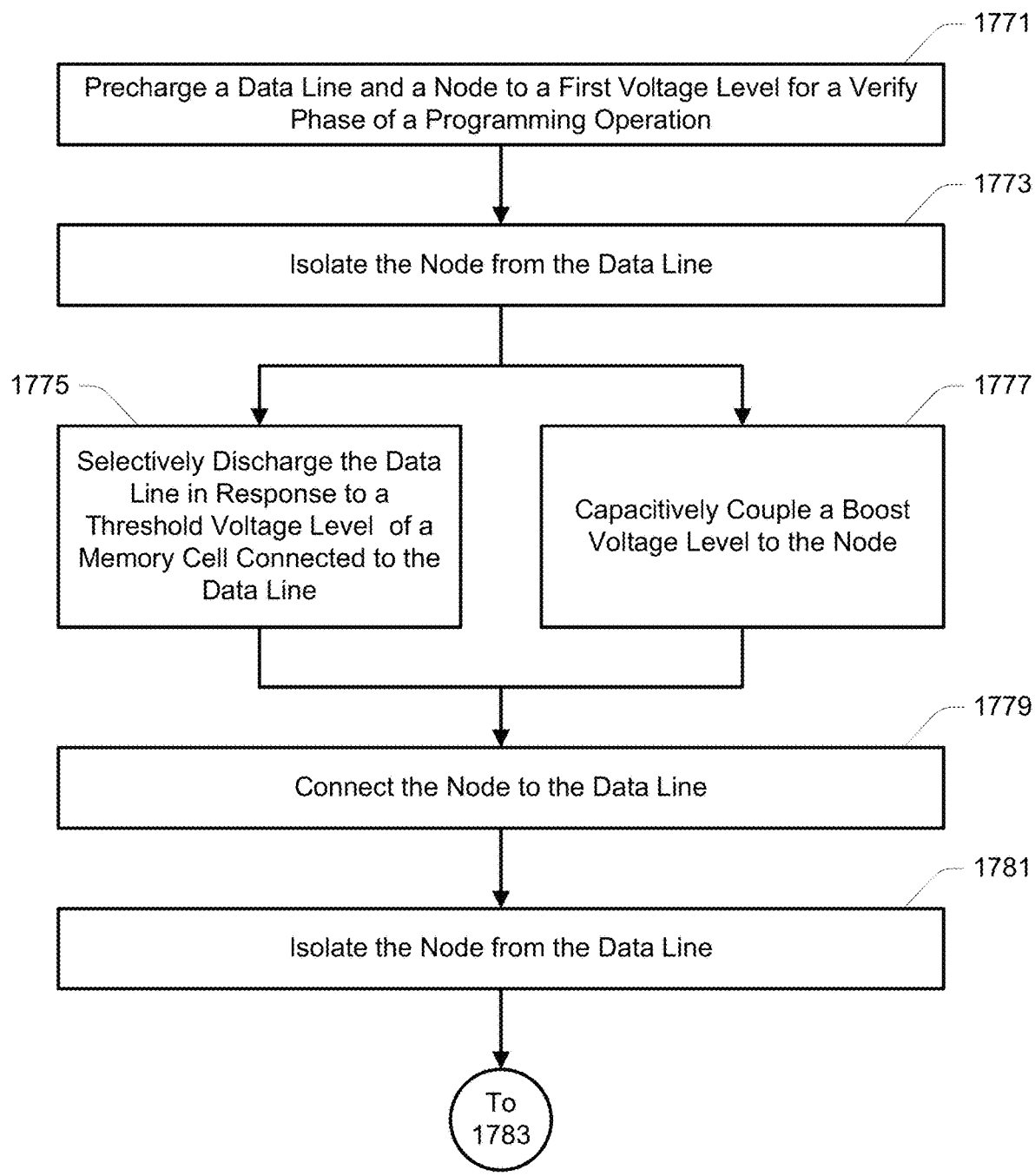
FIGS. 17A-17C are a flowchart of a method of operating a memory in accordance with a still further embodiment.
Figure 17B:
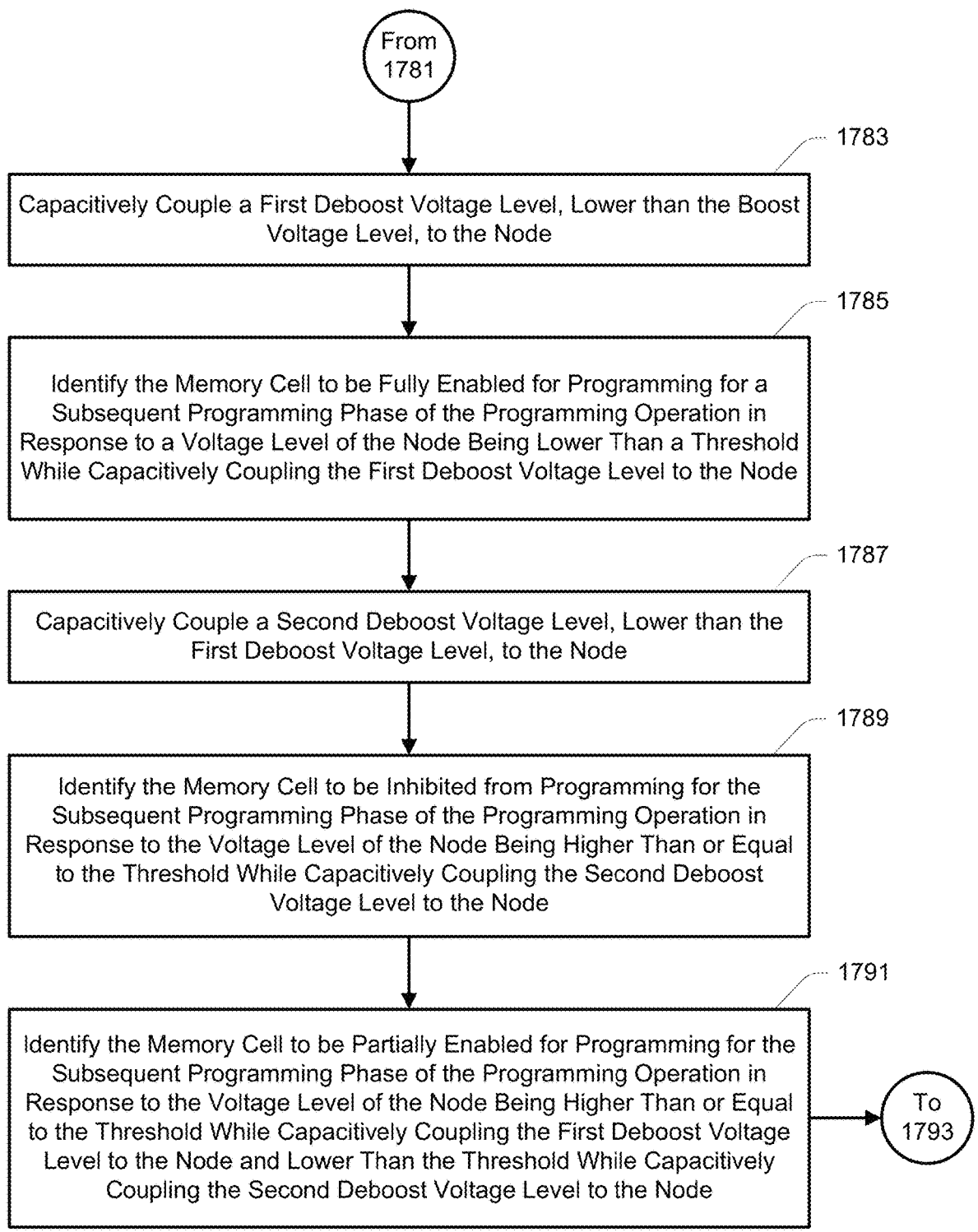
Figure 17C:
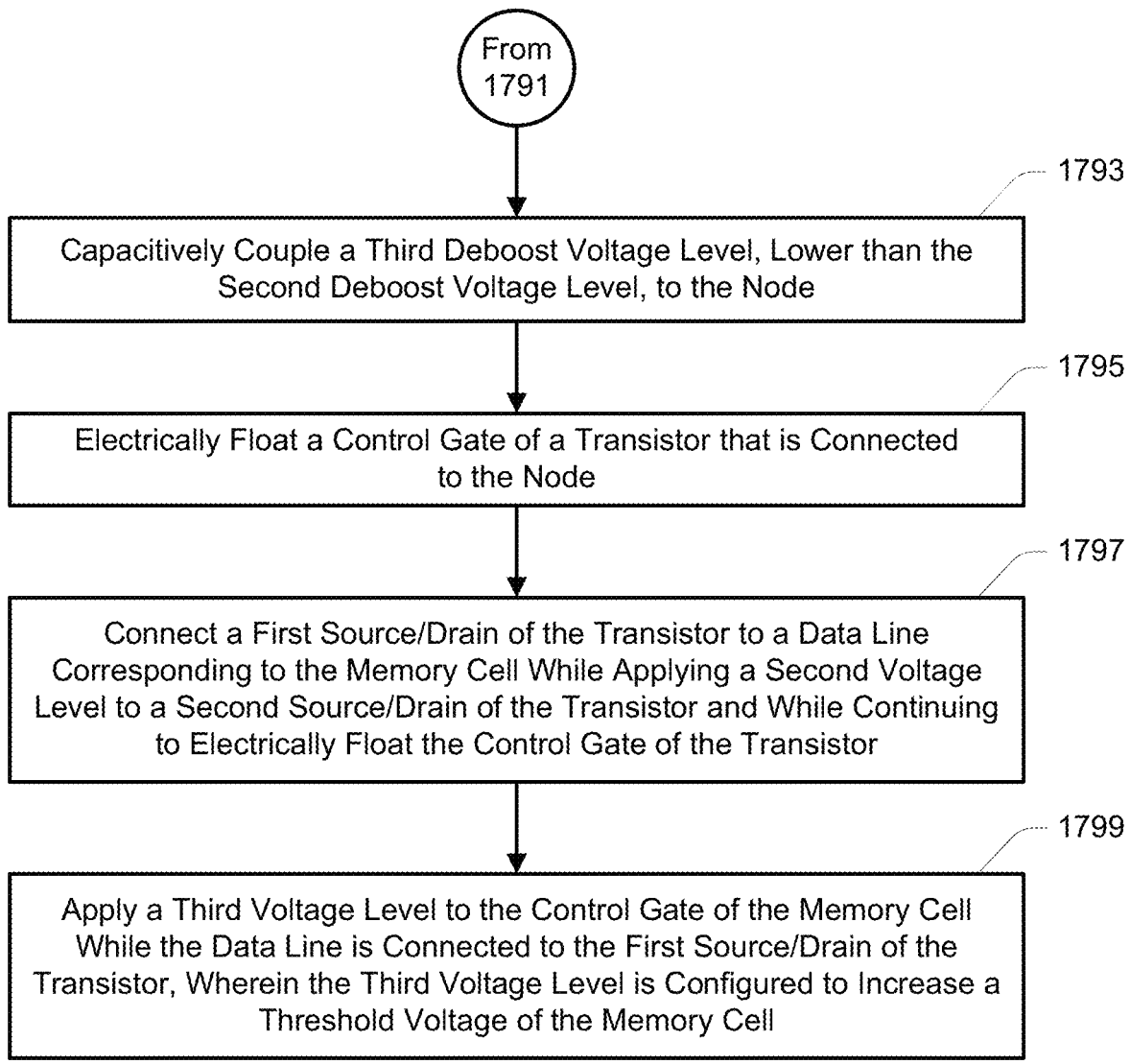

FIGS. 17A-17C are a flowchart of a method of operating a memory in accordance with an embodiment. The method might represent actions associated with a programming operation, e.g., portions of a verify phase and programming phase of the programming operation, performed by the memory. The method might be in the form of computer-readable instructions, e.g., stored to the instruction registers 128. Such computer-readable instructions might be executed by a controller, e.g., the control logic 116, to cause the relevant components of the memory to perform the method.

At 1771, a data line and a node (e.g., of a page buffer circuit) might be precharged to a first voltage level for a verify phase of a programming operation. This might correspond to times t0-t2 of FIG. 10. The first voltage level might correspond to the voltage level 1032 of FIG. 10 where the optional discharge of the data line and node is utilized, or the voltage level 1030 where it is not.

At 1773, the node might be isolated from the data line. This might correspond to time t2 of FIG. 10. At 1775, the data line might be selectively discharged in response to a threshold voltage level of a memory cell connected to the data line. This might correspond to times t2-t3 of FIG. 10. At 1777, a boost voltage level might be capacitively coupled to the node. This might further correspond to times t2-t3 of FIG. 10.

At 1779, the node might be connected to the data line. This might correspond to time t3 of FIG. 10. At 1781, the node might be isolated from the data line. This might correspond to time t4 of FIG. 10.

At 1783, a first deboost voltage level, lower than the boost voltage level, might be capacitively coupled to the node. This might correspond to times t5-t6 of FIG. 10. At 1785, the memory cell might be identified to be fully enabled for programming for a subsequent programming phase of the programming operation in response to a voltage level of the node being lower than a threshold (e.g., a predetermined voltage level) while capacitively coupling the first deboost voltage level to the node. This might correspond to times t6-t7 of FIG. 10. For example, the node might correspond to the tc signal node 432 of the page buffer circuit 400. The threshold might correspond to the threshold voltage level of the transistor 451 of the page buffer circuit 400. In this manner, if the transistor 451 is deemed to be deactivated in response to the voltage level of the tc signal node 431 while the first deboost voltage level is capacitively coupled to the tc signal node 432, the voltage level of the tc signal node 432 might be deemed to be lower than the threshold. A memory cell identified to be fully enabled for programming for a subsequent programming phase of the programming operation might be configured to receive the enable voltage on its corresponding data line for the subsequent programming phase.

At 1787, a second deboost voltage level, lower than the first deboost voltage level, might be capacitively coupled to the node. This might correspond to times t7-t8 of FIG. 10. At 1789, the memory cell might be identified to be inhibited from programming for the subsequent programming phase of the programming operation in response to the voltage level of the node being higher than or equal to the threshold while capacitively coupling the second deboost voltage level to the node. This might correspond to times t8-t9 of FIG. 10. Continuing with the foregoing example, if the transistor 451 is deemed to be activated in response to the voltage level of the tc signal node 431 while the second deboost voltage level is capacitively coupled to the tc signal node 432, the voltage level of the tc signal node 432 might be deemed to be higher than or equal to the threshold. A memory cell identified to be inhibited from programming for a subsequent programming phase of the programming operation might be configured to receive the inhibit voltage on its corresponding data line for the subsequent programming phase.

At 1791, the memory cell might be identified to be partially enabled for programming for the subsequent programming phase of the programming operation in response to the voltage level of the node being higher than or equal to the threshold while capacitively coupling the first deboost voltage level to the node, and lower than the threshold while capacitively coupling the second deboost voltage level to the node. This might correspond to times t5-t6 and times t8-t9 of FIG. 10. Continuing with the foregoing example, if the transistor 451 is deemed to be activated in response to the voltage level of the tc signal node 431 while the first deboost voltage level is capacitively coupled to the tc signal node 432, and the transistor 451 is deemed to be deactivated in response to the voltage level of the tc signal node 431 while the second deboost voltage level is capacitively coupled to the tc signal node 432, the voltage level of the tc signal node 432 might be deemed to be higher than or equal to the threshold while the first deboost voltage level is capacitively coupled to the node, and lower than the threshold while the second deboost voltage level is capacitively coupled to the node. A memory cell identified to be partially enabled for programming for a subsequent programming phase of the programming operation might be configured to receive a voltage level on its corresponding data line for the subsequent programming phase that is between the enable voltage and the inhibit voltage.

At 1793, a third deboost voltage level, lower than the second deboost voltage level, might be capacitively coupled to the node. This might correspond to times t9-t10 of FIG. 10. At 1795, a control gate of a transistor that is connected to the node might be electrically floated, e.g., while the node is capacitively coupled to the third deboost voltage level. The transistor might correspond to the transistor 447 of FIG. 4A, the transistor 1150 of FIG. 11A, or the transistor 1160 of FIG. 11B, for example.

At 1797, a first source/drain of the transistor might be connected to a data line corresponding to the memory cell while applying a second voltage level to a second source/drain of the transistor and while continuing to electrically float the control gate of the transistor. The second voltage level might correspond to (e.g., be equal to) an inhibit voltage level of the programming operation. For other embodiments, the second voltage level might be higher than the inhibit voltage level.

At 1799, a third voltage level might be applied to the control gate of the memory cell while the data line is connected to the first source/drain of the transistor, wherein the third voltage level is configured to increase a threshold voltage of the memory cell. The third voltage level might be a voltage level of a programming pulse determined in response to a value of VgVt for a group of memory cells, e.g., a group of memory cells having a same desired data state for the programming operation, resulting from a prior (e.g., immediately prior) programming pulse, and a desired threshold voltage for that desired data state. The processing of 1793-1799 might be performed in response to identifying the memory cell to be partially enabled for programming for the subsequent programming phase of the programming operation.

The methods of FIGS. 13-17C might be performed multiple times during a programming operation, each time for memory cells having a different desired data state for the programming operation. For example, the method of FIG. 13 might be performed for memory cells to be programmed to the L1 data state from the verify pulse $804_1$ to the programming pulse $802_1$, might be performed for memory cells to be programmed to the L2 data state from the verify pulse $804_2$ to the programming pulse $802_2$, might be performed for memory cells to be programmed to the L3 data state from the verify pulse $804_3$ to the programming pulse $802_3$, and so on. Such a sequence could similarly be used for the method of FIG. 14, the method of FIG. 15, the method of FIGS. 16A-16B, and the method of FIGS. 17A-17C.

Figure 18:
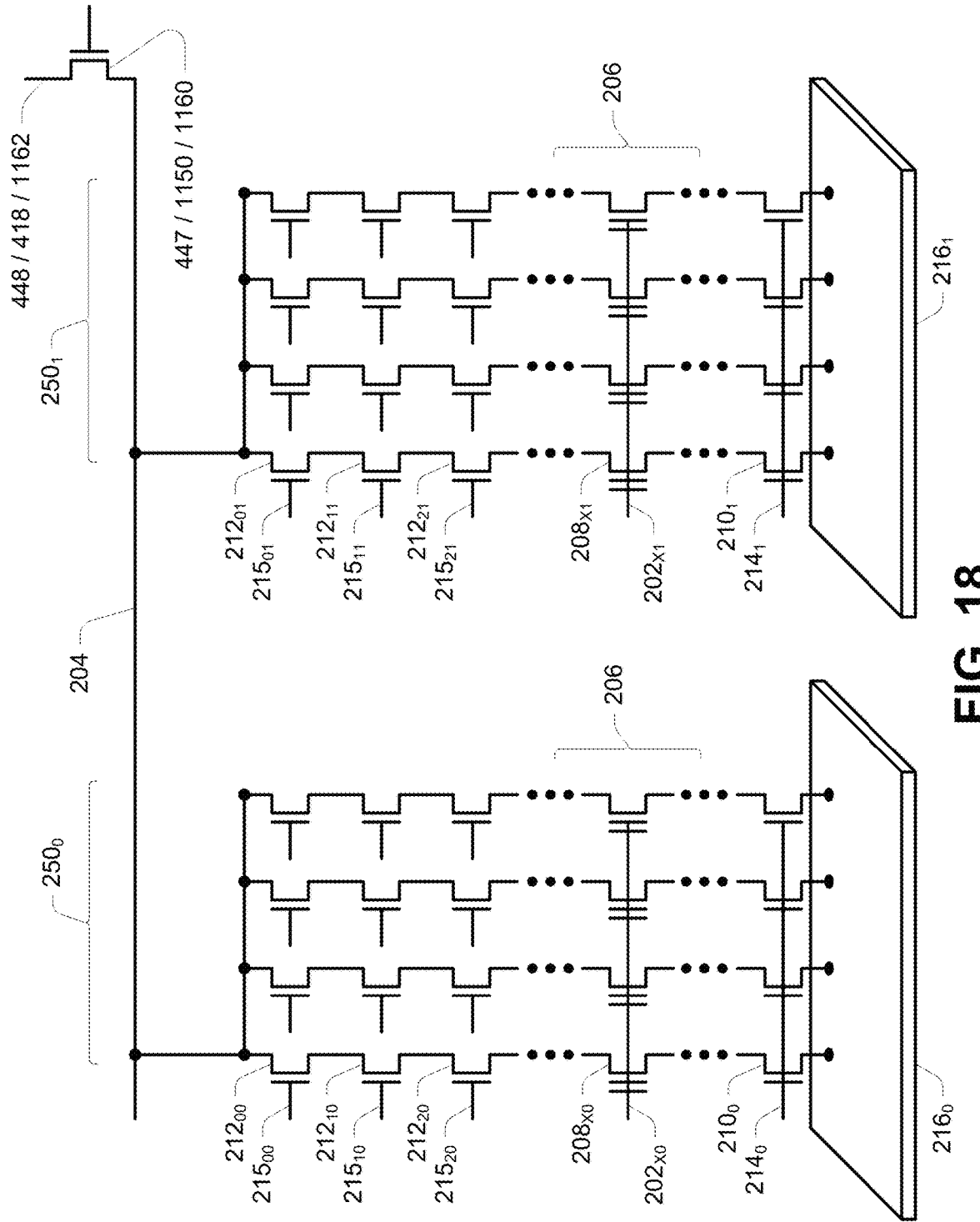
FIG. 18 is a schematic of portions of an array of memory cells in accordance with additional embodiments.

FIG. 18 is a schematic of portions of an array of memory cells in accordance with additional embodiments. Like numbered elements in FIG. 18 correspond to the description as provided with respect to prior figures. It is recognized that various embodiments might be expected to apply a number of different voltage levels to data lines during a programming operation. As such, there may be a concern of interference, or coupling, between adjacent data lines. Where shielding is not available, e.g., programming involves every other data line, a weak pull-down could be applied to a data line receiving its voltage level through a source-follower transistor. FIG. 18 depicts two blocks of memory cells, e.g., a selected block of memory cells $250_0$ and an unselected block of memory cells 2501, that share a data line 204. A memory cell 208, e.g., memory cell $208_{X0}$, of the block of memory cells $250_0$ might be selected for programming, and might be identified to be partially enabled for programming. As such, during its programming pulse, the data line might be connected to a source-follower transistor, e.g., transistor 447, transistor 1150, or transistor 1160, while a voltage node, e.g., voltage node 448, voltage node 418, or voltage node 1162, respectively, is configured to receive its voltage level.

While the data line 204 is connected to its source-follower transistor, the data line 204 might be connected to the common source $216_1$. For example, each drain select line, e.g., drain select lines $215_{20}$, $215_{10}$, and $215_{00}$, might receive a voltage level sufficient to activate a corresponding drain select gate, e.g., drain select gate $212_{20}$, $212_{10}$, and $212_{00}$, respectively, while each access line 202 of the NAND strings 206 of the block of memory cells 2501 receives a voltage level sufficient to activate a corresponding memory cell 208, and while each source select line, e.g., source select line $214_1$, receives a voltage level sufficient to activate a corresponding source select gate, e.g., source select gate $210_1$. In this manner, a pull-down current might be established through an unselected block of memory cells. The pull-down current might be applied for the duration of the data line 204 receiving its voltage level from the source-follower transistor. For other embodiments, the pull-down current might be removed, e.g., isolating the data line 204 from the common source $216_1$, after a steady-state voltage level is established on the data line 204.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A memory, comprising:
   an array of memory cells; and
   a controller for access of the array of memory cells, wherein the controller is configured to cause the memory to:
   apply a first voltage level indicative of a data state of a memory cell of the array of memory cells to a control gate of a transistor;
   retain the first voltage level on the control gate of the transistor;
   connect a first source/drain of the transistor to a data line corresponding to the memory cell while applying a second voltage level to a second source/drain of the transistor and while retaining the first voltage level on the control gate of the transistor; and
   apply a programming pulse to a control gate of the memory cell while the data line is connected to the first source/drain of the transistor.

2. The memory of claim 1, wherein the memory cell is a first memory cell, wherein the data line is a first data line, wherein the programming pulse is a programming pulse of a programming operation, and wherein the controller is further configured to cause the memory to:
   connect a second data line to receive an inhibit voltage level of the programming operation; and
   apply the programming pulse to a control gate of a second memory cell corresponding to the second data line while the second data line is connected to receive the inhibit voltage level.

3. The memory of claim 2, wherein the controller is further configured to cause the memory to:

connect a third data line to receive an enable voltage level of the programming operation; and apply the programming pulse to a control gate of a third memory cell corresponding to the third data line while the third data line is connected to receive the enable voltage level.

4. The memory of claim 3, wherein the inhibit voltage level is higher than the enable voltage level and higher than the first voltage level, and wherein the enable voltage level is lower than the first voltage level.

5. The memory of claim 1, wherein the controller being configured to cause the memory to retain the first voltage level on the control gate of the transistor comprises the controller being configured to cause the memory to electrically float the control gate of the transistor.

6. The memory of claim 1, wherein the controller being configured to cause the memory to apply the first voltage level to the control gate of the transistor comprises the controller being configured to cause the memory to connect the transistor to a node of a page buffer circuit.

7. The memory of claim 6, wherein the controller is further configured to cause the memory to:
discharge the data line through the memory cell; and
after discharging the data line through the memory cell, discharge the node of the page buffer circuit to the data line to develop the first voltage level in response to a voltage level of the data line.

8. The memory of claim 1, wherein the first voltage level is a voltage level that is indicative of a level of current flow through the memory cell during a verify phase of a programming operation.

9. A memory, comprising:
an array of memory cells;
a plurality of data lines, wherein each data line of the plurality of data lines is selectively connected to a respective plurality of memory cells of the array of memory cells;
a plurality of page buffer circuits, wherein each page buffer circuit of the plurality of page buffer circuits is selectively connected to a respective data line of the plurality of data lines; and
a controller for access of the array of memory cells, wherein the controller is configured to cause the memory to:
develop a first voltage level at a node of a page buffer circuit selectively connected to a data line of the plurality of data lines, wherein the first voltage level is indicative of a data state of a memory cell selectively connected to the data line, wherein the memory cell has a first target data state of a plurality of possible data states for a programming operation, and wherein the memory cell has a threshold voltage level lower than a target threshold voltage level for the first target data state;
apply the first voltage level to a control gate of a transistor of the page buffer circuit selectively connected to the node;
retain the first voltage level on the control gate of the transistor;
connect a first source/drain of the transistor to the data line while applying a second voltage level higher than the first voltage level to a second source/drain of the transistor and while retaining the first voltage level on the control gate of the transistor; and
apply a programming pulse of the programming operation to a control gate of the memory cell while the data line is connected to the first source/drain of the transistor.

10. The memory of claim 9, wherein the page buffer circuit is a first page buffer circuit, wherein the data line is a first data line, and wherein the controller is further configured to cause the memory to:
develop a third voltage level at a node of a second page buffer circuit selectively connected to a second data line of the plurality of data lines, wherein the third voltage level is indicative of a data state of a memory cell selectively connected to the second data line, wherein the memory cell selectively connected to the second data line has the first target data state of the plurality of possible data states for the programming operation, wherein the third voltage level is higher than the first voltage level and lower than the second voltage level, and wherein the memory cell selectively connected to the second data line has a threshold voltage level lower than the target threshold voltage level for the first target data state and higher than the threshold voltage level of the memory cell selectively connected to the first data line;
apply the third voltage level to a control gate of a transistor of the second page buffer circuit selectively connected to the node of the second page buffer circuit;
retain the third voltage level on the control gate of the transistor of the second page buffer circuit;
connect a first source/drain of the transistor of the second page buffer circuit to the second data line while applying the second voltage level to a second source/drain of the transistor of the second page buffer circuit and while retaining the third voltage level on the control gate of the transistor of the second page buffer circuit; and
apply the programming pulse to a control gate of the memory cell selectively connected to the second data line while the second data line is connected to the first source/drain of the transistor of the second page buffer circuit.

11. The memory of claim 9, wherein the controller is further configured to cause the memory to:
connect a third data line to receive an inhibit voltage level of the programming operation;
connect a fourth data line to receive an enable voltage level of the programming operation; and
apply the programming pulse to a control gate of the memory cell selectively connected to the third data line while the third data line is connected to receive the inhibit voltage level, and to a control gate of the memory cell selectively connected to the fourth data line while the fourth data line is connected to receive the enable voltage level.

12. The memory of claim 11, wherein the enable voltage level is lower than the first voltage level, and wherein the inhibit voltage level is higher than the third voltage level.

13. The memory of claim 12, wherein the second voltage level is equal to the inhibit voltage level.

14. The memory of claim 11, wherein the memory cell selectively connected to the third data line has a second target data state of the plurality of possible data states for the programming operation, and wherein the second target data state is lower than the first target data state.

15. The memory of claim 11, wherein the memory cell selectively connected to the third data line has the first target data state of the plurality of possible data states for the programming operation, and wherein the memory cell selectively connected to the third data line has a threshold voltage level higher than or equal to the target threshold voltage level for the first target data state.

16. The memory of claim 11, wherein the memory cell selectively connected to the fourth data line has a second target data state of the plurality of possible data states for the programming operation, and wherein the second target data state is higher than the first target data state.

17. The memory of claim 11, wherein the memory cell selectively connected to the fourth data line has the first target data state of the plurality of possible data states for the programming operation, and wherein the memory cell selectively connected to the fourth data line has a threshold voltage level lower than the threshold voltage level of the memory cell selectively connected to the first data line.

18. A memory, comprising:
an array of memory cells;
a plurality of data lines; and
a controller for access of the array of memory cells, wherein the controller is configured to cause the memory to:
develop a first voltage level at a node of a first page buffer circuit, wherein the first voltage level is indicative of a data state of a first memory cell selectively connected to the first page buffer circuit through a first data line of the plurality of data lines, and wherein the first memory cell has a first threshold voltage level;
develop a second voltage level, different than the first voltage level, at a node of a second page buffer circuit, wherein the second voltage level is indicative of a data state of a second memory cell selectively connected to the second page buffer circuit through a second data line of the plurality of data lines, and wherein the second memory cell has a second threshold voltage level different than the first threshold voltage level;
apply the first voltage level to a control gate of a transistor of the first page buffer circuit and retain the first voltage level on the control gate of the transistor of the first page buffer circuit;
apply the second voltage level to a control gate of a transistor of the second page buffer circuit and retain the second voltage level on the control gate of the transistor of the second page buffer circuit;
connect a first source/drain of the transistor of the first page buffer circuit to the first data line while applying a third voltage level to a second source/drain of the transistor of the first page buffer circuit and while retaining the first voltage level on the control gate of the transistor of the first page buffer circuit;
connect a first source/drain of the transistor of the second page buffer circuit to the second data line while applying the third voltage level to a second source/drain of the transistor of the second page buffer circuit and while retaining the second voltage level on the control gate of the transistor of the second page buffer circuit; and
apply a programming pulse of a programming operation to an access line connected to a control gate of the first memory cell and to a control gate of the second memory cell while the first data line is connected to the first source/drain of the transistor of the first page buffer circuit and while the second data line is connected to the first source/drain of the transistor of the second page buffer circuit.

19. The memory of claim 18, wherein the second voltage level is higher than the first voltage level in response to the second threshold voltage level being higher than the first threshold voltage level.

20. The memory of claim 18, wherein the first memory cell and the second memory cell each have a first target data state of a plurality of possible data states for the programming operation and each have a threshold voltage level lower than a target threshold voltage level for the first target data state.

21. The memory of claim 20, wherein the controller is further configured to cause the memory to:
connect a third data line to receive an inhibit voltage level of the programming operation; and
connect a fourth data line to receive an enable voltage level of the programming operation;
wherein the third data line is selectively connected to a third memory cell having a control gate connected to the access line, wherein the third memory has the first target data state for the programming operation, and wherein the third memory cell has a threshold voltage level higher than or equal to the target threshold voltage level for the first data state; and
wherein the fourth data line is selectively connected to a fourth memory cell having a control gate connected to the access line, wherein the fourth memory has the first target data state for the programming operation, and wherein the fourth memory cell has a threshold voltage level lower than a predefined threshold that is lower than the first voltage level and lower than the second voltage level.

* * * * *